US009466373B2

(12) United States Patent
Okada et al.

(10) Patent No.: US 9,466,373 B2
(45) Date of Patent: Oct. 11, 2016

(54) NONVOLATILE SEMICONDUCTOR STORAGE DEVICE

(71) Applicant: Kabushiki Kaisha Toshiba, Minato-ku (JP)

(72) Inventors: Nobuaki Okada, Yokohama (JP); Masayuki Akou, Yokohama (JP); Mitsuhiro Noguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 8 days.

(21) Appl. No.: 14/197,628

(22) Filed: Mar. 5, 2014

(65) Prior Publication Data

US 2015/0187428 A1   Jul. 2, 2015

Related U.S. Application Data

(60) Provisional application No. 61/921,179, filed on Dec. 27, 2013.

(51) Int. Cl.
| | |
|---|---|
| *G11C 16/08* | (2006.01) |
| *G11C 16/10* | (2006.01) |
| *G11C 7/14* | (2006.01) |
| *G11C 8/08* | (2006.01) |
| *G11C 11/56* | (2006.01) |
| *G11C 16/04* | (2006.01) |
| *H01L 27/115* | (2006.01) |

(52) U.S. Cl.
CPC .............. *G11C 16/10* (2013.01); *G11C 7/14* (2013.01); *G11C 8/08* (2013.01); *G11C 11/5621* (2013.01); *G11C 16/0483* (2013.01); *G11C 16/08* (2013.01); *H01L 27/11529* (2013.01); *H01L 27/11536* (2013.01); *H01L 27/11539* (2013.01); *H01L 27/11541* (2013.01); *G11C 2211/5641* (2013.01)

(58) Field of Classification Search
USPC .......................... 365/185.05, 185.17, 185.03
See application file for complete search history.

(56) References Cited

U.S. PATENT DOCUMENTS

| | | | |
|---|---|---|---|
| 5,514,889 A * | 5/1996 | Cho et al. ...................... 257/316 |
| 6,044,017 A * | 3/2000 | Lee .................... G11C 16/0483 |
| | | | 365/185.11 |
| 7,245,534 B2 | 7/2007 | Goda et al. |
| 8,334,557 B2 | 12/2012 | Kutsukake |
| 2005/0180213 A1* | 8/2005 | Abe et al. ................. 365/185.17 |

(Continued)

FOREIGN PATENT DOCUMENTS

| | | |
|---|---|---|
| JP | 11-273369 | 10/1999 |
| JP | 2003-46062 | 2/2003 |

(Continued)

*Primary Examiner* — Hoai V Ho
*Assistant Examiner* — Jay Radke
(74) *Attorney, Agent, or Firm* — Oblon, McClelland, Maier & Neustadt, L.L.P.

(57) ABSTRACT

According to one embodiment, a nonvolatile semiconductor storage device includes a word line transfer unit which transfers voltage applied to a memory cell selected on the basis of an address to a word line. The word line transfer unit includes a word line transfer transistor which is arranged in a first layout area of the word line transfer unit and transfers voltage applied to the memory cell to the word line and a dummy word line transfer transistor which is arranged in a second layout area provided outside an end of the first layout area and does not transfer voltage applied to the memory cell to the word line.

20 Claims, 22 Drawing Sheets

(56) References Cited

U.S. PATENT DOCUMENTS

| | | | |
|---|---|---|---|
| 2006/0146610 A1* | 7/2006 | Takeuchi | G11C 7/1051 365/185.17 |
| 2008/0239822 A1* | 10/2008 | Kosaki et al. | 365/185.17 |
| 2008/0297234 A1* | 12/2008 | Moholt | G05F 3/262 327/541 |
| 2009/0021982 A1* | 1/2009 | Matsunaga | G11C 11/5635 365/185.17 |
| 2009/0310414 A1* | 12/2009 | Lee | G11C 8/12 365/185.17 |
| 2010/0124117 A1* | 5/2010 | Kutsukake et al. | 365/185.11 |
| 2010/0277977 A1* | 11/2010 | Nakamura | G11C 16/16 365/185.03 |
| 2013/0229871 A1 | 9/2013 | Li | |

FOREIGN PATENT DOCUMENTS

| | | |
|---|---|---|
| JP | 2005-347331 | 12/2005 |
| JP | 4034594 | 1/2008 |
| JP | 2010-123186 | 6/2010 |
| JP | 2011-71343 | 4/2011 |
| JP | 2013-69387 | 4/2013 |

\* cited by examiner

CHANNEL WIDTH W OF WORD LINE TRANSFER TRANSISTOR

NONVOLATILE SEMICONDUCTOR STORAGE DEVICE

CROSS-REFERENCE TO RELATED APPLICATIONS

This application is based upon and claims the benefit of priority from Provisional Patent Application No. 61/921,179, filed on Dec. 27, 2013; the entire contents of which are incorporated herein by reference.

FIELD

Embodiments described herein relate generally to a nonvolatile semiconductor storage device.

BACKGROUND

In a NAND-type flash memory, a high voltage of approximately 15 to 30 V may be applied to a word line during writing or erasing. Therefore, there is a NAND-type flash memory that is provided with a word line transfer transistor which transfers such a high voltage to a word line.

DETAILED DESCRIPTION

In general, according to one embodiment, the nonvolatile semiconductor storage device includes a memory cell array in which electrically writable and erasable memory cells are arranged in a matrix form in a row direction and a column direction, a word line which transmits voltage applied to the memory cells in the row direction, and a word line transfer unit which transfers voltage applied to a memory cell selected on the basis of an address to the word line. The word line transfer unit includes a word line transfer transistor which is arranged in a first layout area of the word line transfer unit and transfers voltage applied to the memory cells to the word line, and a dummy word line transfer transistor which is arranged in a second layout area provided outside an end of the first layout area and does not transfer voltage applied to the memory cells to the word line.

Exemplary embodiments of the nonvolatile semiconductor storage device will be explained below in detail with reference to the accompanying drawings. The present invention is not limited to the following embodiments.

(First Embodiment)

Figure 1:
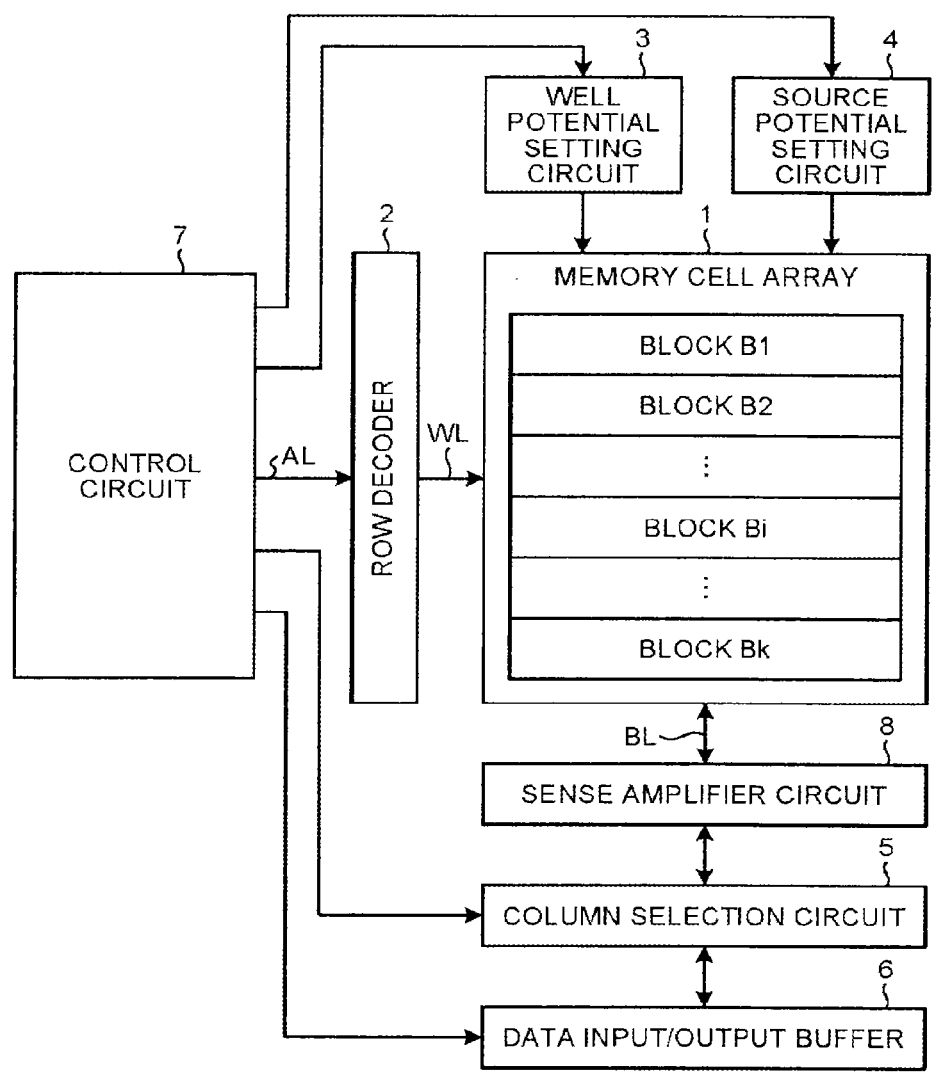
FIG. 1 is a block diagram illustrating the schematic configuration of a nonvolatile semiconductor storage device according to a first embodiment.

FIG. 1 is a block diagram illustrating the schematic configuration of a nonvolatile semiconductor storage device according to the first embodiment.

In FIG. 1, in the nonvolatile semiconductor storage device, a memory cell array 1, a row decoder 2, a well potential setting circuit 3, a source potential setting circuit 4, a column selection circuit 5, a data input/output buffer 6, a control circuit 7, and a sense amplifier circuit 8 are provided.

In the memory cell array 1, memory cells which store data are arranged in a matrix form in the row direction and the column direction. Each of the memory cells may store one bit of binary-level data, or may also be multileveled so as to store two bits or more of multi-level data.

The memory cell array 1 is divided into k blocks B1 to Bk (k is a positive integer). Each of the blocks B1 to Bk can be configured by arranging a plurality of NAND cells in the row direction. Further, in the memory cell array 1, a bit line BL which transmits a potential corresponding to data stored in the memory cells in the column direction and a word line WL which transmits voltage applied to the memory cells in the row direction are provided.

The row decoder 2 can select memory cells in the row direction of the memory cell array 1 during reading/writing/erasing operations of the memory cells. A row address AL is input to the row decoder 2. The row decoder 2 can select a word line WL of any one of the blocks B1 to Bk on the basis of the row address AL, and output the drive signal DL to a the word line WL of the selected block. The well potential setting circuit 3 can set the well potential of the memory cell array 1 during reading/writing/erasing operations of the memory cells. The source potential setting circuit 4 can set the source potential of the memory cell array 1 during reading/writing/erasing operations of the memory cells. The column selection circuit 5 can select memory cells in the column direction of the memory cell array 1 during reading/writing/erasing operations of the memory cells. The sense amplifier circuit 8 can discriminate data read out from the memory cells for each of the columns. The data input/output buffer 6 can transmit a command and an address received from the outside to the control circuit 7, and can perform transmission and reception of data with the sense amplifier circuit 8 and the outside. The control circuit 7 can control operations of the row decoder 2, the well potential setting circuit 3, the source potential setting circuit 4, and the column selection circuit 5 on the basis of a command and an address.

Figure 2:
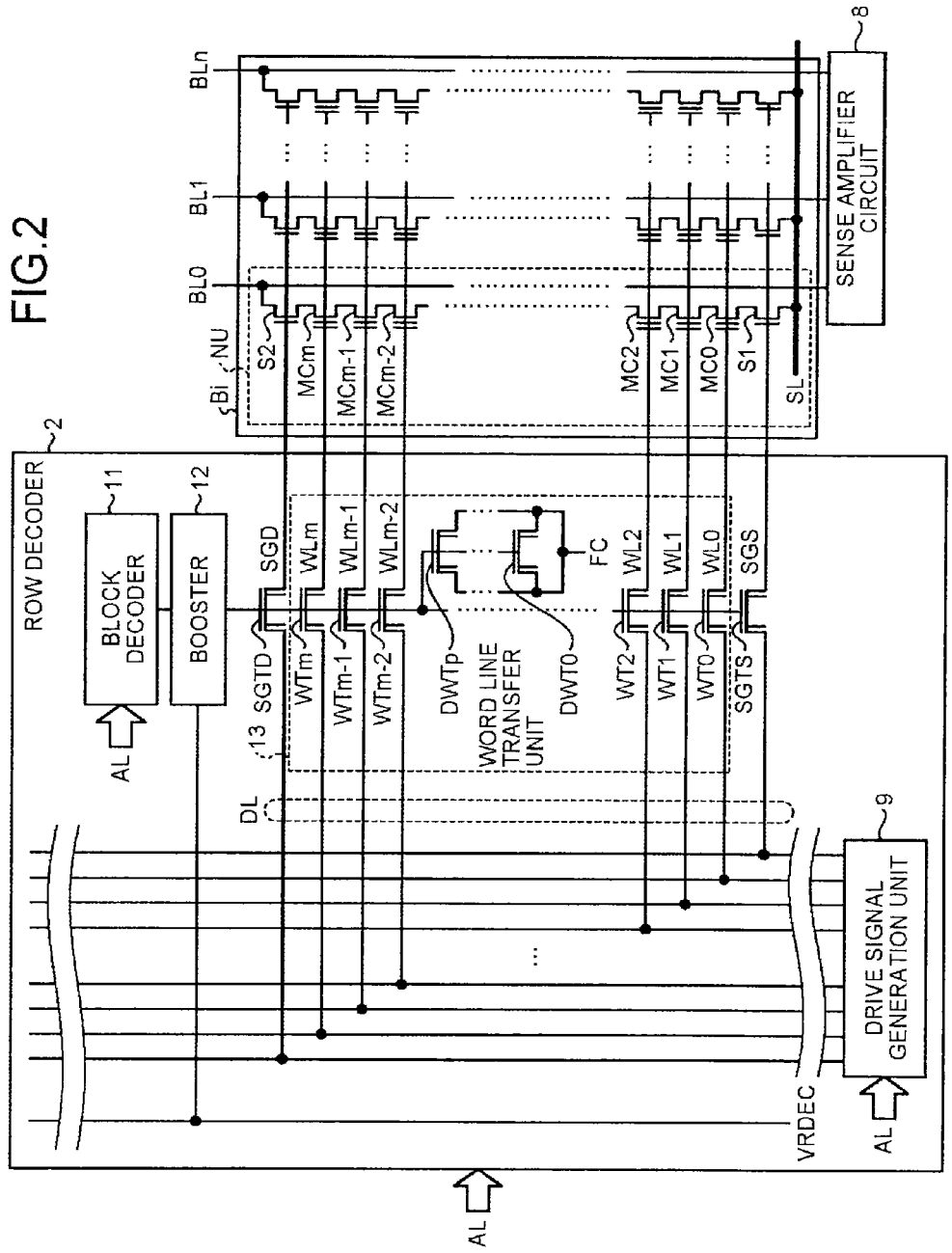
FIG. 2 is a circuit diagram illustrating the schematic configuration of a block and a row decoder of the nonvolatile semiconductor storage device of FIG. 1.

FIG. 2 is a circuit diagram illustrating the schematic configuration of the block and the row decoder of the nonvolatile semiconductor storage device of FIG. 1.

In FIG. 2, in each of the blocks B1 to Bk, there are provided m+1 word lines WL0 to WLm (m is an integer equal to or larger than zero), select gate lines SGD and SGS, and a source line SL. Further, n+1 bit lines BL0 to BLn (n is an integer equal to or larger than zero) are commonly provided in each of the blocks B1 to Bk.

Further, n+1 NAND cells NU are provided in each of the blocks B1 to Bk. The NAND cells NU are connected to the respective bit lines BL0 to BLn.

In each of the NAND cells NU, cell transistors MC0 to MCm and select transistors S1 and S2 are provided. Each of the memory cells of the memory cell array 1 can comprise a single cell transistor. The cell transistors MC0 to MCm are connected in series to each other to thereby form an NAND string. The select transistors S1 and S2 are connected to opposite ends of the NAND string to thereby construct each of the NAND cells NU.

In each of the NAND cells NU, the word lines WL0 to WLm are respectively connected to control gate electrodes of the cell transistors MC0 to MCm. A plurality of memory cells in the row direction which share each of the word lines WL0 to WLm construct a page. In each of the NAND cells NU, one end of the NAND string which includes the cell transistors MC0 to MCm is connected to each of the bit lines BL0 to BLn through the select transistor S2, and the other end of the NAND string is connected to the source line SL through the select transistor S1. The select gate line SGS is connected to a gate electrode of the select transistor S1. The select gate line SGD is connected to a gate electrode of the select transistor S2.

In the row decoder 2, there are provided a block decoder 11, a booster 12, a word line transfer unit 13, select gate line transfer transistors SGTS and SGTD and a drive signal generation unit 9. The block decoder 11 can be provided for each of the blocks B1 to Bk. The drive signal generation unit 9 can be shared between the blocks B1 to Bk. The row address AL is input to the drive signal generation unit 9 and the block decoder 11. Then, the word line WL of any one of the blocks B1 to Bk, the one being designated by the row address AL, is selected. A boost voltage VRDEC is input to the booster 12. The boost voltage VRDEC is supplied to any one of the blocks B1 to Bk, the one being selected by the block decoder 11. Word line transfer transistors WT0 to WTm and dummy word line transfer transistors DWT0 to DWTp (p is an integer equal to or larger than zero) are provided in the word line transfer unit 13. The word line transfer transistors WT0 to WTm can transfer voltage applied to the cell transistors MC0 to MCm to the word lines WL0 to WLm, respectively. On the other hand, voltage applied to the cell transistors MC0 to MCm is not transferred to the word lines WL0 to WLm through the dummy word line transfer transistors DWT0 to DWTp. That is, drains and sources of the dummy word line transfer transistors DWT0 to DWTp can be made not to be electrically connected to the NAND cells NU. The select gate line transfer transistors SGTS and SGTD can transfer voltage applied to the select transistors S1 and S2 to the select gate lines SGS and SGD, respectively. The word line transfer transistors WT0 to WTm and the select gate line transfer transistors SGTS and SGTD do not necessarily have the same configuration.

Voltage output from the booster 12 is input to the gates of the word line transfer transistors WT0 to WTm, the select gate line transfer transistors SGTS and SGTD, and the dummy word line transfer transistors DWT0 to DWTp. The word lines WL0 to WLm are respectively connected to the sources of the word line transfer transistors WT0 to WTm. The select gate lines SGS and SGD are respectively connected to the sources of the select gate line transfer transistors SGTS and SGTD. Drive signal lines CG0 to CGm are respectively connected to the drains of the word line transfer transistors WT0 to WTm. Drive signal lines SG1 and SG2 are respectively connected to the drains of the select gate line transfer transistors SGTS and SGTD. The drains and the sources of the dummy word line transfer transistors DWT0 to DWTp are connected to a fixed potential line FC. The drive signal lines CG0 to CGm, SG1, and SG2 are provided in the drive signal generation unit 9. The word lines WL0 to WLm and the select gate lines SGS and SGD can be arranged in a layer that is lower than the drive signal lines CG0 to CGm, SG1, and SG2.

The dummy word line transfer transistors DWT0 to DWTp can be arranged near the boundary between the memory cell array 1 and the word line transfer unit 13 (between a layout area of the word line transfer transistors WT0 to WTm and the memory cell array 1). Alternatively, the dummy word line transfer transistors DWT0 to DWTp may also be arranged near the boundary between the drive signal generation unit 9 and the word line transfer unit 13. Alternatively, the dummy word line transfer transistors DWT0 to DWTp may also be arranged along the outer periphery of the layout area of the word line transfer transistors WT0 to WTm.

Figure 3:
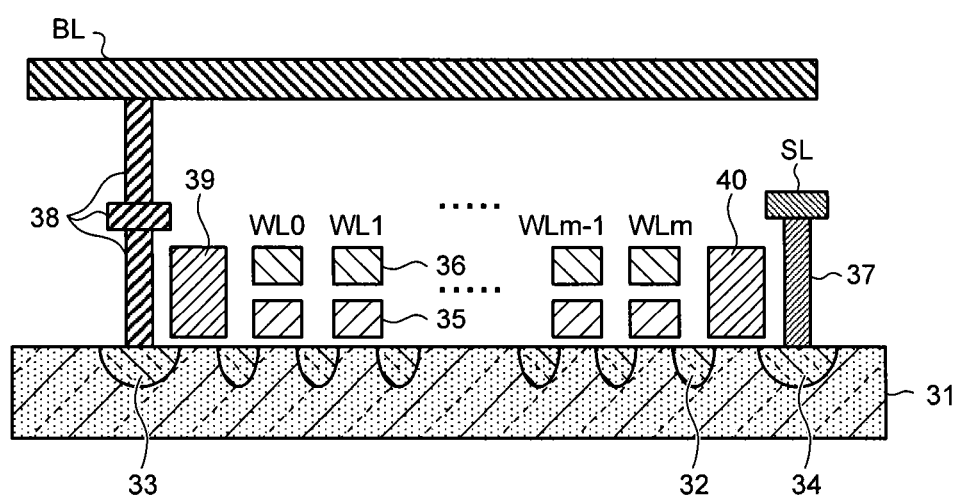
FIG. 3 is a cross-sectional view illustrating the schematic configuration of one NAND cell of the nonvolatile semiconductor storage device of FIG. 1.

FIG. 3 is a cross-sectional view illustrating the schematic configuration of one NAND cell of the nonvolatile semiconductor storage device of FIG. 1.

In FIG. 3, a charge storage layer(s) 35, and select gate electrodes 39 and 40 are arranged on a well 31 with a gate insulation film interposed therebetween. A control gate electrode(s) 36 is arranged on the charge storage layer(s) 35 with an inter-electrode insulation film interposed therebetween. In a planar NAND flash memory, a floating gate can be used as the charge storage layer(s) 35. The thickness of the gate insulation film can be set to approximately 1 to 10 nm.

In the well 31, there are formed an impurity diffusion layer 32 which is arranged between the charge storage layers 35 or between the charge storage layer(s) 35 and the select gate electrodes 39 and 40, and impurity diffusion layers 33 and 34 each of which is arranged between select gate electrodes 39 and 40 of adjacent NAND cells. For example, the well 31 can be formed into P type, and each of the impurity diffusion layers 32, 33 and 34 can be formed into N type.

The impurity diffusion layer 33 is connected to the bit line BL through a connection conductor 38. The impurity diffusion layer 34 is connected to the source line SL through a connection conductor 37. The control gate electrode(s) 36 of each of the memory cells is connected to the word lines WL0 to WLm. The select gate electrodes 39 and 40 are respectively connected to the select gate lines SGD and SGS.

Figure 4:
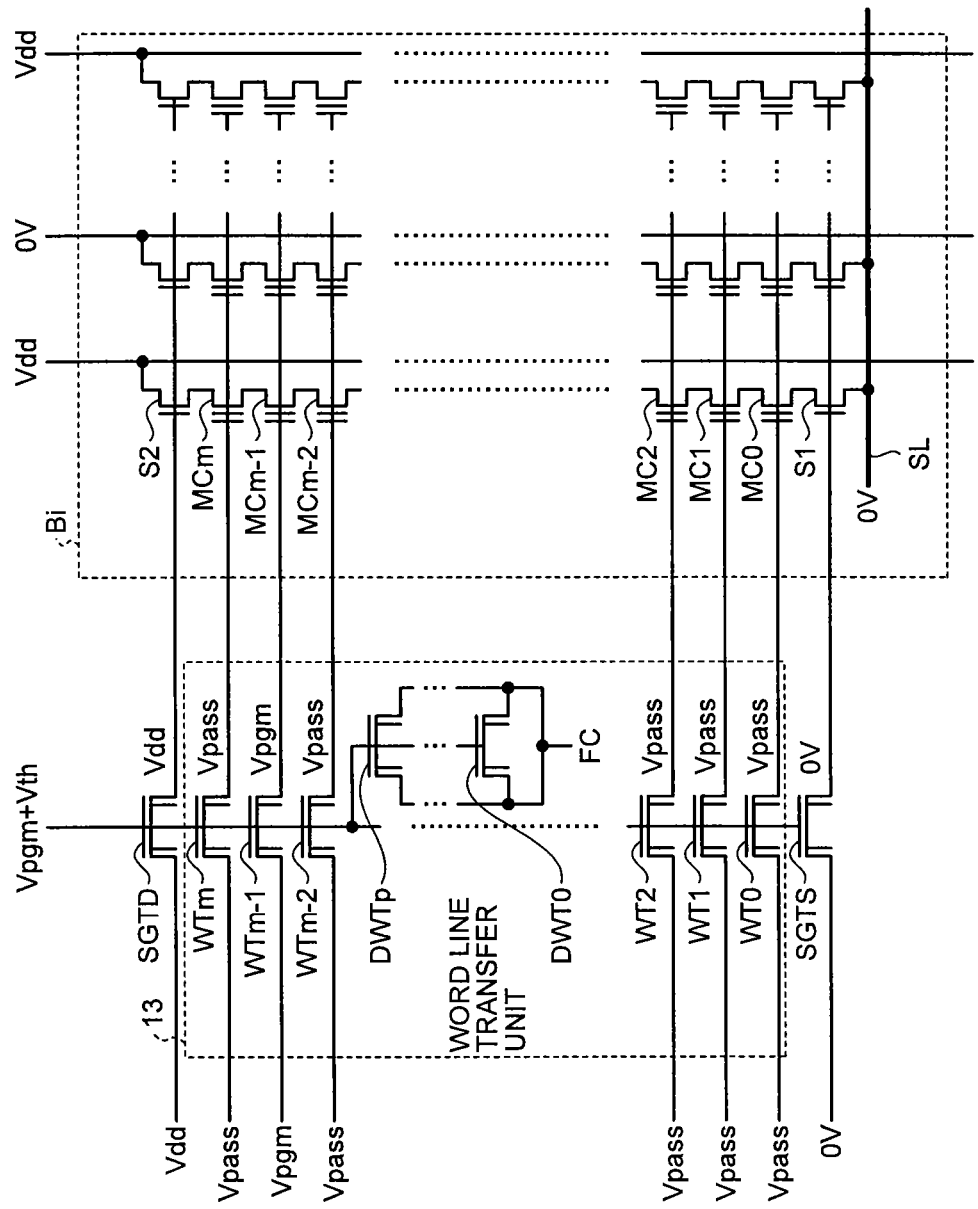
FIG. 4 is a circuit diagram illustrating the potential relationship of the block and a word line transfer unit of FIG. 2 during writing selection.

FIG. 4 is a circuit diagram illustrating the potential relationship of the block and the word line transfer unit of FIG. 2 during writing selection.

In FIG. 4, in a writing operation, when the threshold voltage of the word line transfer transistors WT0 to WTm and the select gate line transfer transistors SGTS and SGTD is denoted by Vth, the boost voltage VRDEC is set to Vpgm+Vth, and applied to the gates of the word line transfer transistors WT0 to WTm and the select gate line transfer transistors SGTS and SGTD through the booster 12.

Accordingly, the word line transfer transistors WT0 to WTm and the select gate line transfer transistors SGTS and SGTD of a selected block Bi are turned on, and a drive signal DL that has been transmitted respectively through the drive signal lines CG0 to CGm, SG1, and SG2 is applied to the word lines WL0 to WLm, and the select gate lines SGS and SGD. At this time, a writing voltage Vpgm (20 V, for example) is applied to a selected word line, and a voltage of 0 V is applied to a selected bit line. A pass voltage Vpass that is sufficient to turn on an unselected cell of a NAND string that includes a selected cell is applied to an unselected word line. A voltage that turns on the select transistor S2 (Vdd, for example) is applied to the select gate line SGD, and a voltage that turns off the select transistor S1 (0 V, for example) is applied to the select gate line SGS.

Accordingly, the voltage of 0 V applied to the selected bit line is transferred to the selected cell through the select transistor S2 and the unselected cell, and the well 31 and the impurity diffusion layer 32 are set to 0 V. At this time, since the writing voltage Vpgm is applied to the selected word line, a high voltage is applied to the control gate electrode 36 of the selected cell. As a result, the potential of the charge storage layer 35 of the selected cell increases. Therefore, charge is injected from a channel of the selected cell into the charge storage layer 35 due to a tunneling phenomenon, and the threshold of cell transistors MC0 to MCm of the selected cell thereby increases. As a result, a writing operation of the selected cell is executed.

On the other hand, in a NAND cell that is connected to an unselected bit line, by applying a writing inhibit voltage Vdd (2.5 V, for example) to the unselected bit line, the select transistor S2 is turned off. As a result, the cell transistors MC0 to MCm of the NAND cell connected to the unselected bit line become a floating state, and the potential of a channel of an unselected cell that is connected to the selected word line increases (self-boost) so as to follow the writing voltage Vpgm applied to the selected word line. Therefore, in the unselected cell, charge is not injected from the channel into the charge storage layer 35. As a result, it is possible to prevent the threshold voltage of cell transistors MC0 to MCm of the unselected cell from increasing.

On the other hand, in an erasing operation, a voltage of 0 to 1 V is applied to the word lines WL0 to WLm of each of the blocks B1 to Bk, and the well potential of the memory cell array 1 is set to a erasing voltage Ve (20 V, for example). At this time, a high voltage is applied between the well 31 and control gate electrodes 36 of memory cells of each of the blocks B1 to Bk, and charge stored in the charge storage layers 35 is extracted. As a result, the threshold of the cell transistors MC0 to Mcm of each of the blocks B1 to Bk decreases, and the erasing operation of the memory cells is thereby executed.

In a reading operation, a reading voltage Vrg is applied to a selected word line, and an intermediate voltage (2.5 V, for example) that is sufficient to turn on unselected cell transistors MC0 to MCm is applied to an unselected word line. Further, an intermediate voltage that is sufficient to turn on the select transistors S1 and S2 is applied to the select gate lines SGS and SGD. Further, a pre-charge voltage is applied to a selected bit line, and a voltage of 0 V is applied to the source line SL.

At this time, when the threshold of a selected cell has not reached a reading level, charge charged in the selected bit line is discharged through the NAND string, and the potential of the selected bit line becomes a low level. On the other hand, when the threshold of the selected cell has reached the reading level, charge charged in the selected bit line is not discharged through the NAND string. Therefore, the potential of the selected bit line becomes a high level.

Then, whether the potential of the selected bit line is a low level or a high level is detected by the sense amplifier circuit 8, thereby determining whether or not the threshold of the selected cell has reached the reading level. Then, data stored in the selected cell is read out.

Figure 5:
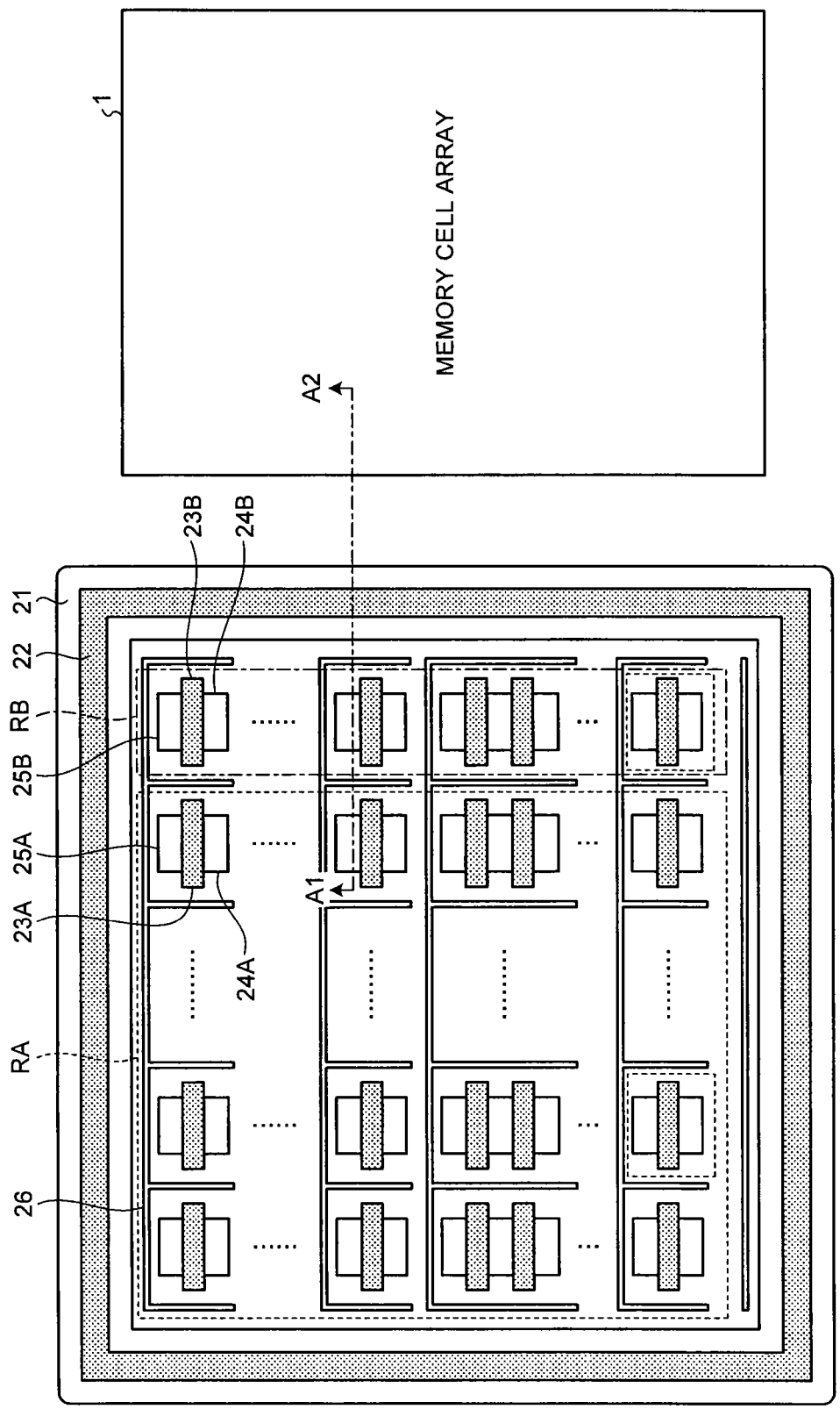
FIG. 5 is a plan view illustrating an example of the layout of the word line transfer unit of FIG. 2.

FIG. 5 is a plan view illustrating an example of the layout of the word line transfer unit of FIG. 2.

In FIG. 5, a first layout area RA and a second layout area RB are provided in the layout area of the word line transfer unit 13. The second layout area RB is provided between the first layout area RA and the memory cell array 1. The word line transfer transistors WT0 to WTm are arranged in the first layout area RA in an array form of X column(s) x Y row(s) (X and Y are positive integers). A gate electrode 23A and low concentration impurity diffusion layers 24A and 25A are provided in each of the word line transfer transistors WT0 to WTm. The low concentration impurity diffusion layer 24A can serve as a drain layer, and the low concentration impurity diffusion layer 25A can serve as a source layer. The channel length of the word line transfer transistors WT0 to WTm can be set, for example, to 0.8 μm to 3.0 μm, and the channel width thereof can be set, for example, to 1.0 μm to 5.0 μm.

In the second layout area RB, one column x Y row(s) of dummy word line transfer transistors DWT0 to DWTp are arranged. A gate electrode 23B and low concentration impurity diffusion layers 24B and 25B are provided in each of the dummy word line transfer transistors DWT0 to DWTp. The low concentration impurity diffusion layer 24B can serve as a drain layer, and the low concentration impurity diffusion layer 25B can serve as a source layer. The gate width direction of the word line transfer transistors WT0 to WTm and the dummy word line transfer transistors DWT0 to DWTp can be the same as the row direction. The channel width of the dummy word line transfer transistors DWT0 to DWTp can be set to have a difference of 0 μm or more and 0.2 μm or less from the channel width of the word line transfer transistors WT0 to WTm, and the channel length thereof can be set to have a difference of 0 μm or more and 0.2 μm or less from the channel length of the word line transfer transistors WT0 to WTm. The low concentration impurity diffusion layers 24A, 24B, 25A, and 25B can be set to N⁻ type.

In order to prevent deterioration of the transistor reliability characteristics and the leakage characteristics, the shape and the size of the dummy word line transfer transistors DWT0 to DWTp are preferably the same as the shape and the size of the word line transfer transistors WT0 to WTm. Further, the element isolation interval between the dummy word line transfer transistors DWT0 to DWTp and the word line transfer transistors WT0 to WTm is preferably substantially the same as the element isolation interval between the word line transfer transistors WT0 to WTm. Active areas of the word line transfer unit 13 are preferably arranged so as to have a distance of, for example, 0.5 μm or more and 3.2 μm or less therebetween in order to achieve both of a reduction in punch-through leakage current flowing between the word line transfer transistors WT0 to WTm and a reduction in the chip area.

A well 21 is formed around the layout area of the word line transfer unit 13. A shunt line is formed on the well 21. The well 21 can comprise a P type impurity diffusion layer. A shield gate 26 is formed around each of the word line transfer transistors WT0 to WTm and each of the dummy word line transfer transistors DWT0 to DWTp.

Figure 6:
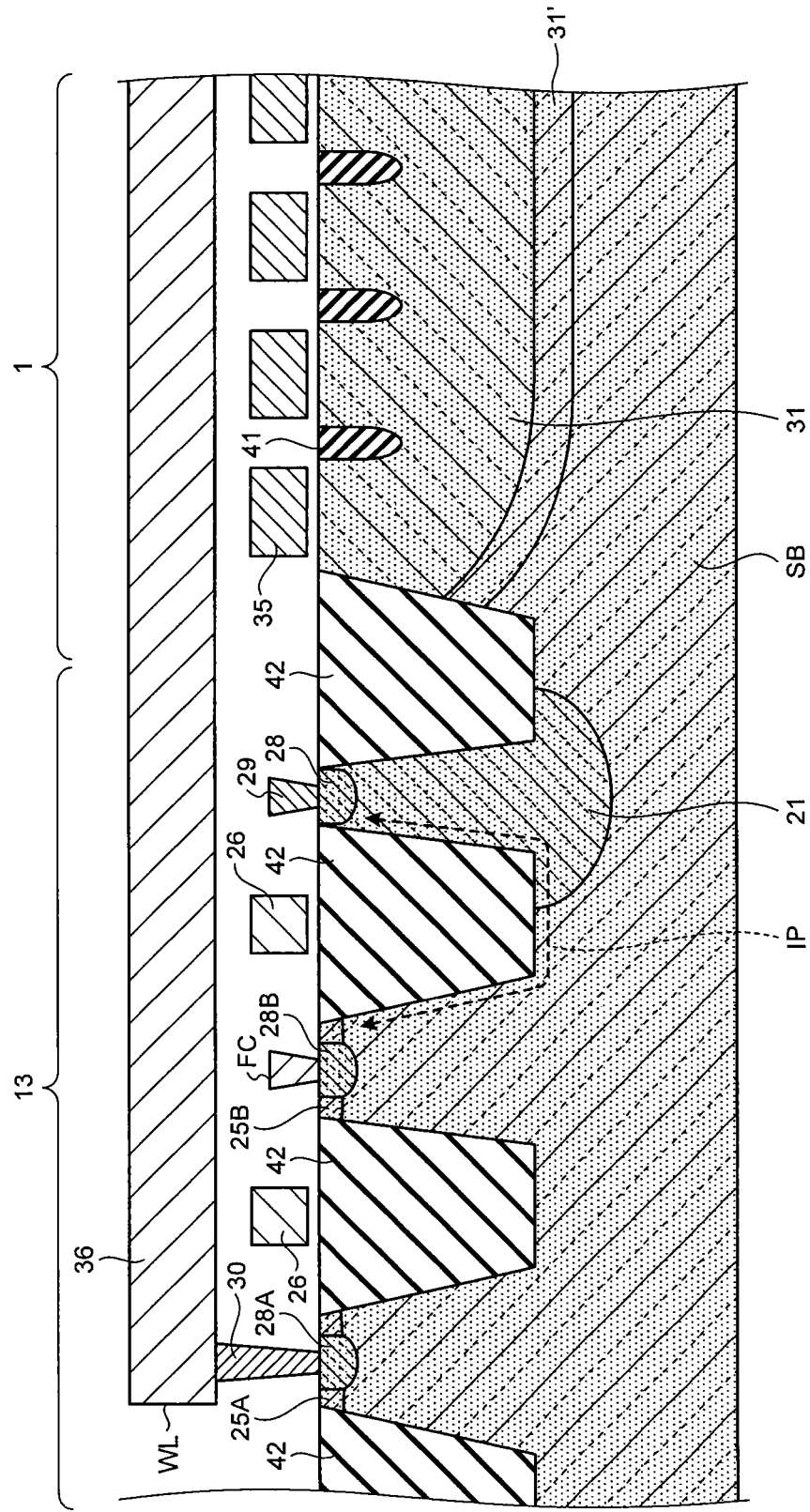
FIG. 6 is a cross-sectional view taken along line A1-A2 of FIG. 5.

FIG. 6 is a cross-sectional view taken along line A1-A2 of FIG. 5. In the example of FIG. 6, the case where the memory cell array 1 and the word line transfer unit 13 are adjacent to each other is shown. However, another transistor or the like may be provided between the memory cell array 1 and the word line transfer unit 13.

In FIG. 6, the wells 21 and 31 and an element isolation region 41 are formed on a semiconductor substrate SB. A well 31' is formed between the well 31 and the semiconductor substrate SB. The semiconductor substrate SB can be set to P⁻ type, the well 31' can be set to N type and the wells 21 and 31 can be set to P type. In order to maintain junction withstand voltage even when a high voltage in the range of 15 V to 35 V is applied to the drain layers or the source layers of the word line transfer transistors WT0 to WTm or the dummy word line transfer transistors DWT0 to DWTp, the boron concentration of the semiconductor substrate SB can be set to the range of $10^{14}$ cm⁻³ to $5\times10^{16}$ cm⁻³. The memory cell array 1 can be formed on the well 31. Active areas of the memory cell array 1 are separated from each other by the element isolation region 41. An element isolation region 42 is formed in a part of the semiconductor substrate SB in which the word line transfer unit 13 is formed. The active areas of the word line transfer unit 13 are separated from each other by the element isolation region 42. For example, a shallow trench isolation (STI) structure can be used in the element isolation regions 41 and 42. As the material of the element isolation regions 41 and 42, a silicon oxide film, polysilazane (PSZ), or non-doped silicate glass can be used, for example. The well 21 is formed along the outer periphery of the layout area of the word line transfer unit 13. A high concentration impurity diffusion layer 28 is formed on the surface of the well 21. The high concentration impurity diffusion layer 28 can be set to P⁺ type. In order to reduce the substrate resistance in P type region, the boron concentration of the well 21 can be set to the range of $1\times10^{17}$ cm⁻³ to $10^{18}$ cm⁻³. The high concentration impurity diffusion layer 28 is connected to a shunt line 22 through a contact plug 29. As the material of the contact plug 29, tungsten can be used, for example. The high concentration impurity diffusion layer 28 can improve the ohmic characteristics with the contact plug 29. The active areas of the word line transfer transistors WT0 to WTm and the dummy word line transfer transistors DWT0 to DWTp can be separated from the well 21, for example, by 0.6 μm or more and 3.0 μm or less. A voltage of 0 V is applied to the shunt line 22, and the voltage is made to be easily transmitted to the semiconductor substrate SB through the well 21. As a result, even when a high voltage is applied to the word line transfer unit 13, the potential of the semiconductor substrate SB can be stabilized.

Further, the low concentration impurity diffusion layers 25A and 25B are formed on the semiconductor substrate SB. High concentration impurity diffusion layers 28A and 28B are respectively formed on the low concentration impurity diffusion layers 25A and 25B. The high concentration impurity diffusion layers 28A and 28B can be set to N⁺ type. The high concentration impurity diffusion layer 28B is connected to the fixed potential line FC. The high concentration impurity diffusion layer 28A is connected to the word line WL through a contact plug 30. The shield gate 26 is formed on the element isolation region 42 on the inner side of the well 21. A voltage of 0 V is applied to the shield gate 26, thereby making it possible to prevent the occurrence of punch-through even when a high voltage is applied to the word line transfer unit 13.

Figure 7:
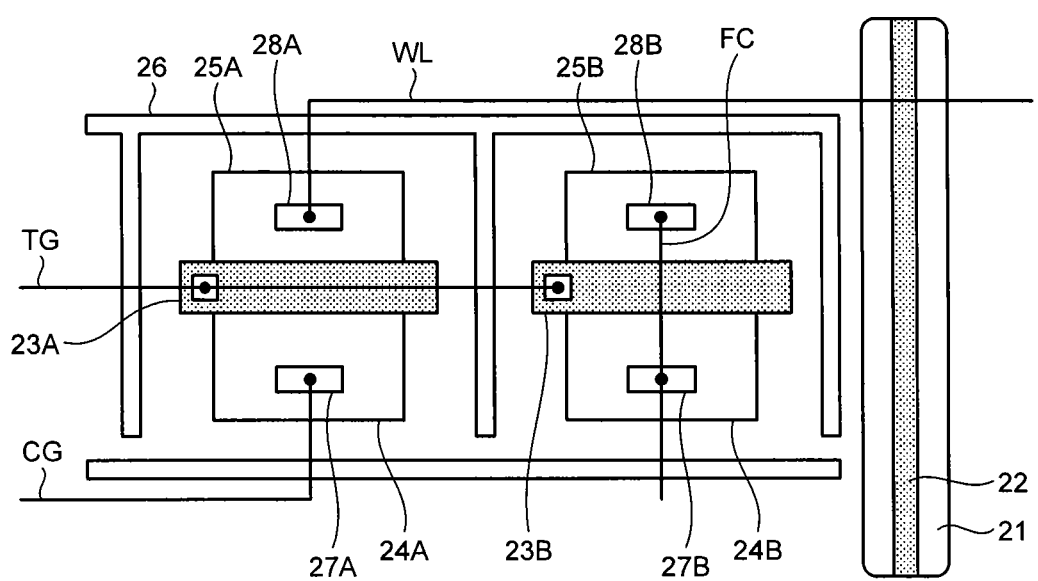
FIG. 7 is a plan view illustrating an example of connection of a word line transfer transistor and a dummy word line transfer transistor of the word line transfer unit of FIG. 5.

FIG. 7 is a plan view illustrating an example of connection of the word line transfer transistor and the dummy word line transfer transistor of the word line transfer unit of FIG. 5.

In FIG. 7, the gate electrode 23A, and the low concentration impurity diffusion layers 24A and 25A are provided in each of the word line transfer transistors WT0 to WTm. A high concentration impurity diffusion layer 27A and the high concentration impurity diffusion layer 28A are respectively formed on the low concentration impurity diffusion layers 24A and 25A. The high concentration impurity diffusion layer 27A is connected to the drive signal line CG. The high concentration impurity diffusion layer 28A is connected to the word line WL. The gate electrode 23A is connected to a transfer gate line TG. The transfer gate line TG can transmit voltage output from the booster 12.

The gate electrode 23B and the low concentration impurity diffusion layers 24B and 25B are provided in each of the dummy word line transfer transistors DWT0 to DWTp. A high concentration impurity diffusion layer 27B and the high concentration impurity diffusion layer 28B are respectively formed on the low concentration impurity diffusion layers 24B and 25B. The high concentration impurity diffusion layers 27B and 28B are connected to the fixed potential line FC. The gate electrode 23B is connected to the transfer gate line TG. In order to reduce punch-through leakage current of the dummy word line transfer transistors DWT0 to DWTp, a voltage of 2.0 V or more and 10 V or less can be applied to the fixed potential line FC. Further, the low concentration impurity diffusion layers 24A, 25A, 24B, and 25B can be used as LDD layers.

Further, one or more and four or less contact plugs which comprise, for example, tungsten can be provided on each of the gate electrodes 23A and 23B and the high concentration impurity diffusion layers 27A, 28A, 27B, and 28B to electrically connect the gate electrodes 23A and 23B and the high concentration impurity diffusion layers 27A, 28A, 27B, and 28B to various signal lines. In order to reduce the contact resistance, the high concentration impurity diffusion layers 27A, 28A, 27B, and 28B may be silicided.

Figure 8:
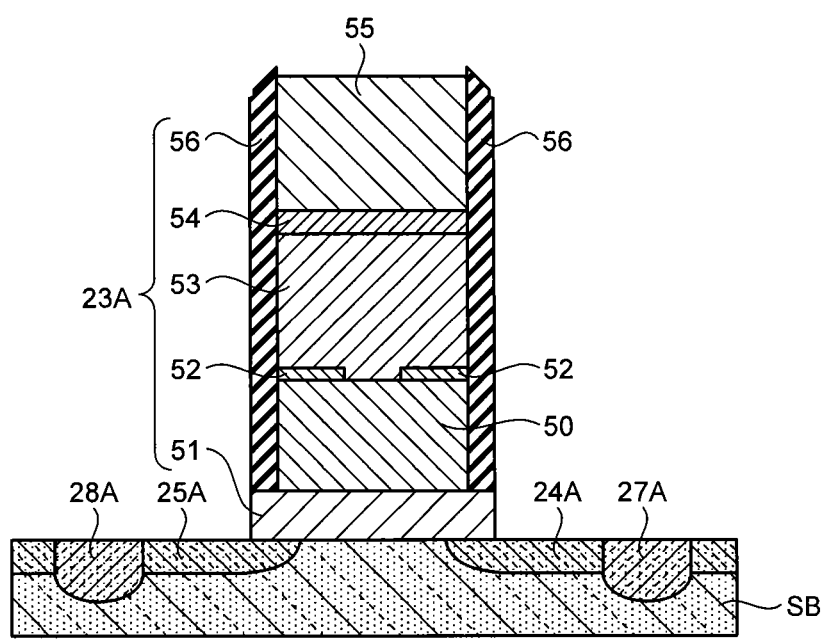
FIG. 8 is a cross-sectional view illustrating the schematic configuration of a high voltage transistor which is applied to the word line transfer transistor and the dummy word line transfer transistor of FIG. 7.

FIG. 8 is a cross-sectional view illustrating the schematic configuration of a high voltage transistor which is applied to the word line transfer transistor and the dummy word line transfer transistor of FIG. 7. The high voltage transistor used as the word line transfer transistor refers to a transistor to which a voltage of 15 V or more is applied. Although the word line transfer transistor of FIG. 7 is taken as an example in FIG. 8, the dummy word line transfer transistor of FIG. 7 can also be configured in the same manner.

In FIG. 8, a lower gate electrode 50 is formed on the semiconductor substrate SB with a gate insulation film 51 interposed therebetween. In the semiconductor substrate SB, for example, boron can be doped as a P-type impurity. The P-type impurity concentration from the surface of the semiconductor substrate SB up to a depth of 1 μm can be set to $10^{14}$ cm$^{-3}$ or more and $5\times10^{16}$ cm$^{-3}$ or less. The gate insulation film 51 can be formed using a silicon oxide film or a silicon oxynitride film having a thickness in the range of 25 nm to 50 nm as a material. The gate insulation film 51 is preferably more than twice as thick as a tunnel insulation film of the memory cell transistor. For example, by setting the thickness of the gate insulation film 51 to 25 nm or more, even if a high voltage of 20 V or more is applied between the lower gate electrode 50 and the semiconductor substrate SB, it is possible to prevent the occurrence of tunnel leakage and thereby prevent deterioration of the reliability of the MOS transistor. The lower gate electrode 50 can be formed simultaneously with the charge storage layer 35 of the memory cell transistor, and also formed using the same material as the charge storage layer 35. For example, the lower gate electrode 50 can be formed using, for example, conductive polycrystalline silicon to which phosphorus, arsenic, or boron is added in the concentration of $10^{18}$ cm$^{-3}$ to $10^{21}$ cm$^{-3}$. The thickness of the lower gate electrode 50 can be set, for example, to the range of 30 nm to 120 nm.

An upper gate electrode 53 is formed on the lower gate electrode 50 with an inter-electrode insulation film 52 interposed therebetween. The lower gate electrode 50 and the upper gate electrode 53 are connected to each other through an opening which is formed on the inter-electrode insulation film 52. As the inter-electrode insulation film 52, for example, a silicon oxide film/silicon nitride film/silicon oxide film, a silicon nitride film/silicon oxide film/silicon nitride film/silicon oxide film/silicon nitride film, a silicon oxide film/AlO$_x$/silicon oxide film, a silicon oxide film/HfAlO$_x$/silicon oxide film, a silicon oxide film/HfO$_x$/silicon oxide film, or a silicone oxide film, having an entire thickness of 2 nm to 30 nm, can be used. The upper gate electrode 53 can have a three-layer structure in which, for example, a polysilicon film having a thickness in the range of 10 nm to 100 nm, tungsten nitride (WN) having a thickness in the range of 2 nm to 40 nm, and tungsten (W) having a thickness in the range of 10 nm to 100 nm are laminated in this order.

The upper gate electrode 53 can be formed simultaneously with the control gate electrode 36 of the memory cell transistor.

A cap layer 54 and a mask layer 55 are formed in this order on the upper gate electrode 53. A side wall 56 is formed on side walls of the lower gate electrode 50, the inter-electrode insulation film 52, the upper gate electrode 53, the cap layer 54, and the mask layer 55. As the cap layer 54, for example, silicon nitride (SiN) having a thickness in the range of 2 nm to 100 nm can be used. As the mask layer 55, for example, SiO$_2$ or silicon nitride (SiN) having a thickness in the range of 2 nm to 100 nm can be used. As the side wall 56, for example, SiO$_2$, SiN, or a laminated film of SiO$_2$ and SiN having a thickness in the range of 10 nm to 100 nm can be used.

In the semiconductor substrate SB, the low concentration impurity diffusion layers 24A and 25A are formed on opposite sides of a channel region located under the lower gate electrode 50. The high concentration impurity diffusion layers 27A and 28A are respectively formed on the low concentration impurity diffusion layers 24A and 25A. Each of the low concentration impurity diffusion layers 24A and 25A includes, for example, phosphorus, arsenic, or antimony so as to have a surface concentration of $10^{19}$ cm$^{-3}$ to $10^{22}$ cm$^{-3}$, and the junction depth within a region of 0.05 μm or more and 2 μm or less can be set to 10 nm to 300 nm. The high concentration impurity diffusion layers 27A and 28A can be formed so as to have a distance of 0.3 μm or more and 1.5 μm or less from the gate electrode so that surface junction withstand voltage can be maintained when a voltage of 15 V or more is applied to the drain layer and the source layer and a voltage of 0 V is applied to the gate electrode.

Figure 9:
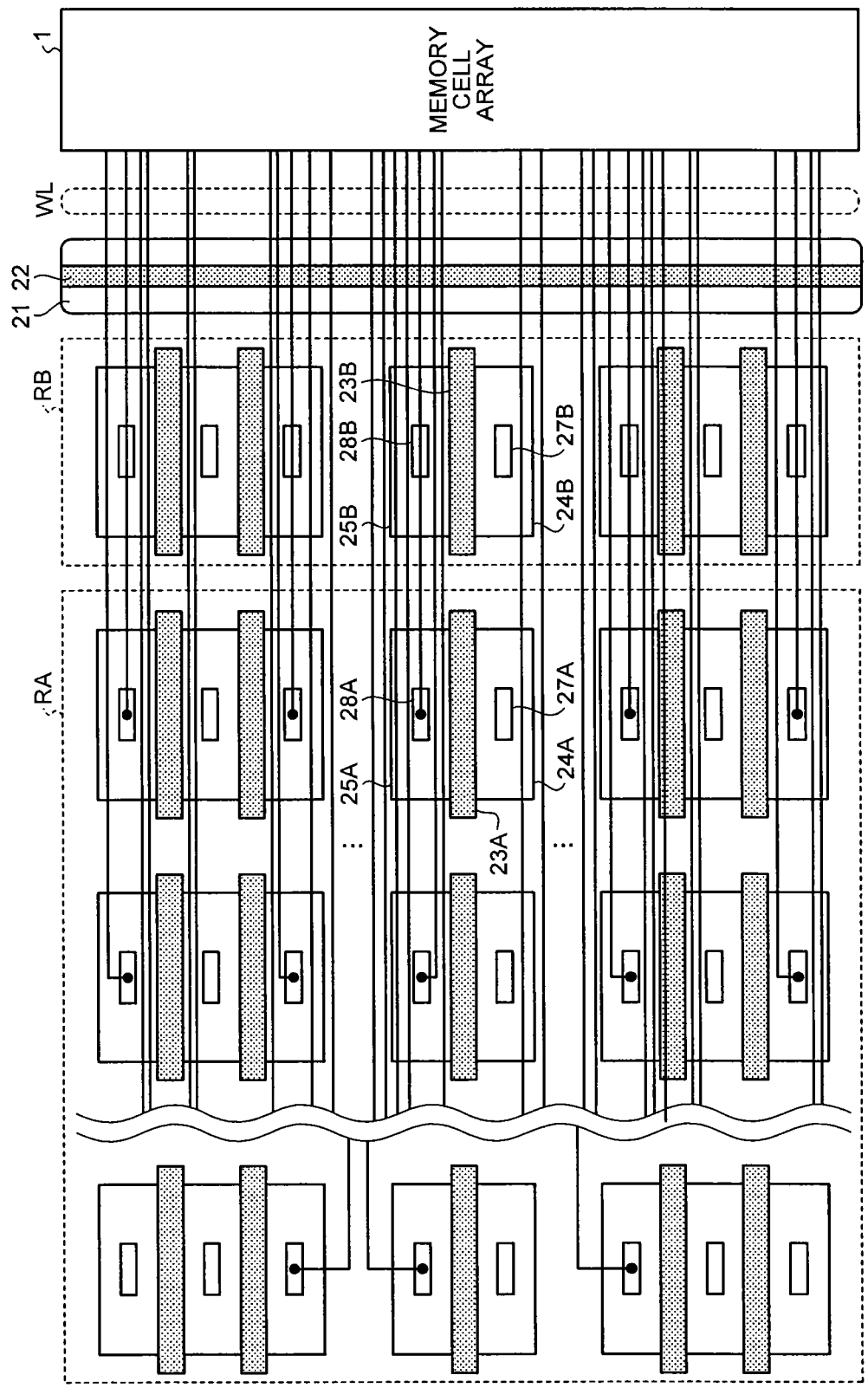
FIG. 9 is a plan view illustrating the wiring position of word lines between the word line transfer unit and a memory cell array of FIG. 5.

FIG. 9 is a plan view illustrating the wiring position of word lines between the word line transfer unit and the memory cell array of FIG. 5.

In FIG. 9, the word line transfer transistors WT0 to WTm are arranged in an array form in the row direction and the column direction. Therefore, the word lines WL which are connected to the word line transfer transistors WT0 to WTm pass above the word line transfer transistors WT0 to WTm so as to be connected to the memory cell array 1. In this case, all of the word lines WL which are connected to the word line transfer transistors WT0 to WTm pass through the boundary between the memory cell array 1 and the first layout area RA. Therefore, when a high voltage of 15 V or more and 30 V or less is applied to a word line WL during writing or erasing, especially in some of the word line transfer transistors WT0 to WTm located near the boundary between the memory cell array 1 and the first layout area RA, an electric field is likely to affect the interface of the semiconductor substrate SB beyond the element isolation region 42. As a result, the interface potential of the semiconductor substrate SB increases, thereby allowing a charge IP from the shunt line 22 to easily flow thereto, as illustrated in FIG. 6.

By providing the second layout area RB in the boundary between the memory cell array 1 and the first layout area RA, and arranging the dummy word line transfer transistors DWT0 to DWTp in the second layout area RB, it is possible to allow the influence caused by potential variation of the word lines WL to be received in the dummy word line transfer transistors DWT0 to DWTp, thereby preventing the influence caused by potential variation of the word lines WL from easily reaching the word line transfer transistors WT0 to WTm. Therefore, in the word line transfer transistors WT0 to WTm, it is possible to reduce a threshold voltage variation ΔVth and an on-current variation ΔIon caused by the potential variation of the word lines WL. As a result, it is possible to suppress a reduction in the reliability and reduce operation failure.

The drive signal lines CG0 to CGm can be arranged in a layer that is higher than the word lines WL0 to WLm. In this case, the influence caused by potential variation of the drive signal lines CG0 to CGm is smaller than the influence caused by potential variation of the word lines WL0 to WLm. Therefore, even when the dummy word line transfer transistors DWT0 to DWTp are arranged only in the boundary between the memory cell array 1 and the first layout area RA, it is possible to effectively reduce the threshold voltage variation ΔVth and the on-current variation ΔIon, and suppress an increase in the layout area.

(Second Embodiment)

Figure 10:
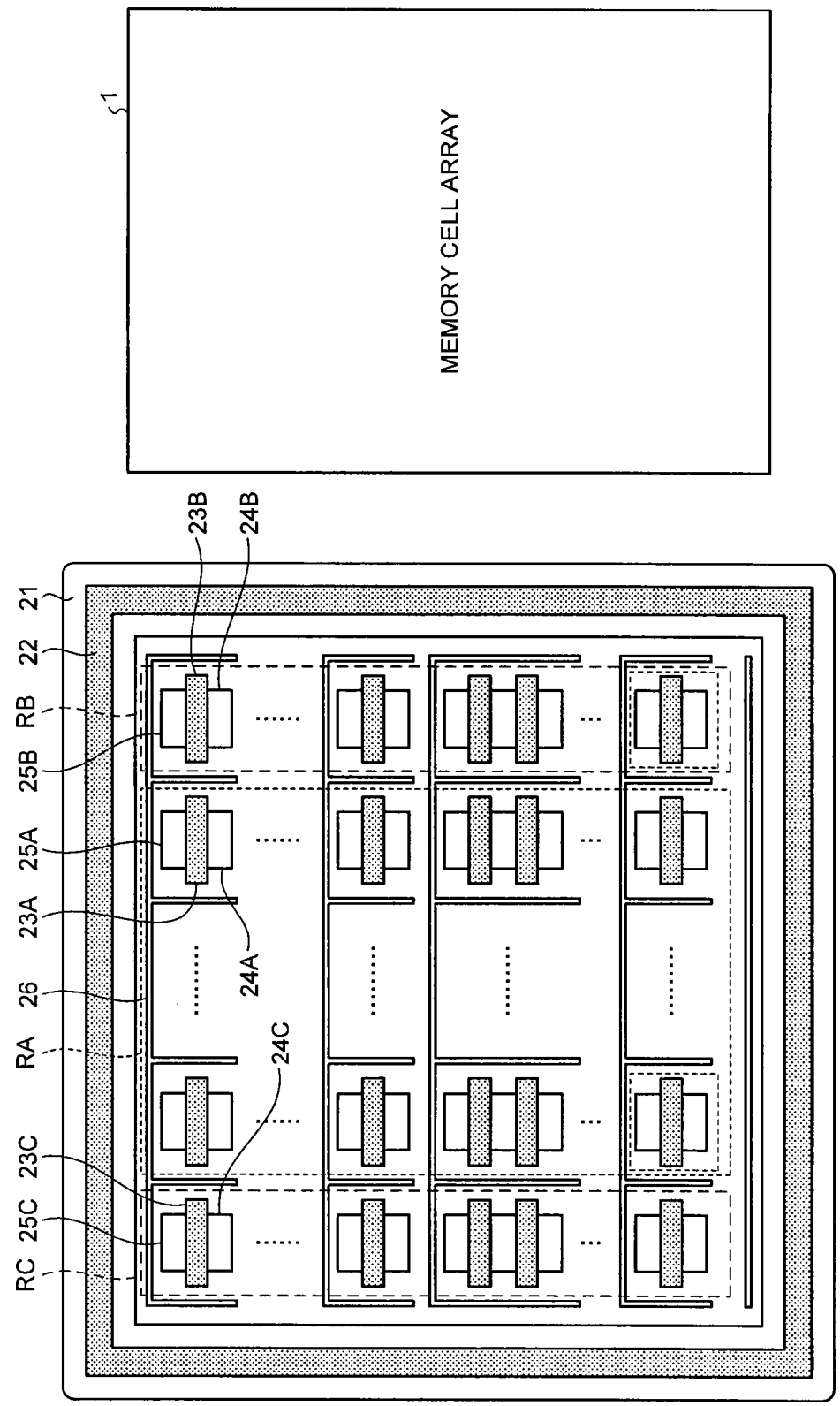
FIG. 10 is a plan view illustrating an example of the layout of a word line transfer unit which is applied to a nonvolatile semiconductor storage device according to a second embodiment.

FIG. 10 is a plan view illustrating an example of the layout of a word line transfer unit which is applied to a nonvolatile semiconductor storage device according to the second embodiment.

In FIG. 10, in the layout area of the word line transfer unit, a third layout area RC is added to the configuration of FIG. 5. The third layout area RC is provided on the opposite side of a memory cell array 1 with a first layout area RA interposed therebetween. In the third layout area RC, one column x Y row(s) of dummy word line transfer transistors are arranged. In each of the dummy word line transfer transistors, a gate electrode 23C and low concentration impurity diffusion layers 24C and 25C are provided. The impurity diffusion layer 24C can serve as a drain layer, and the low concentration impurity diffusion layer 25C can serve as a source layer. The dummy word line transfer transistors in the third layout area RC can be configured in the same manner as the dummy word line transfer transistors in the second layout area RB.

By providing the third layout area RC on the opposite side of the memory cell array 1 with the first layout area RA interposed therebetween, and arranging the dummy word line transfer transistors in the third layout area RB, it is possible to allow the influence caused by potential variation of drive signal lines CG0 to CGm to be received in the dummy word line transfer transistors, thereby preventing the influence cause by potential variation of the drive signal lines CG0 to CGm from easily reaching word line transfer transistors. Therefore, in the word line transfer transistors, it is possible to reduce a threshold voltage variation ΔVth and an on-current variation ΔIon caused by the potential variation of the drive signal lines CG0 to CGm. As a result, it is possible to suppress a reduction in the reliability and reduce operation failure.

(Third Embodiment)

Figure 11:
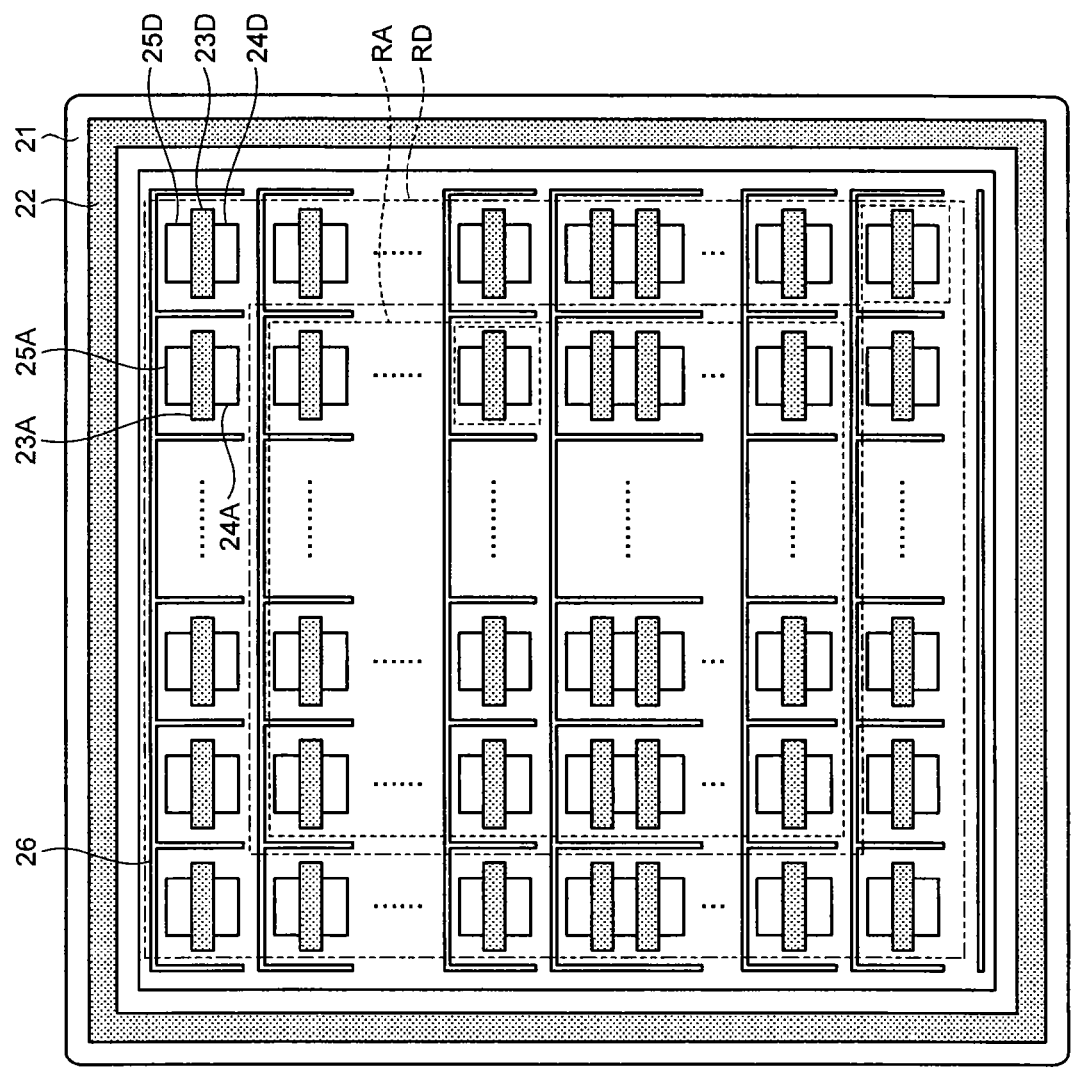
FIG. 11 is a plan view illustrating an example of the layout of a word line transfer unit which is applied to a nonvolatile semiconductor storage device according to a third embodiment.

FIG. 11 is a plan view illustrating an example of the layout of a word line transfer unit which is applied to a nonvolatile semiconductor storage device according to the third embodiment.

In FIG. 11, in the layout area of the word line transfer unit, a fourth layout area RD is provided instead of the second layout area RB of FIG. 5. The fourth layout area RD is arranged along the outer periphery of a first layout area RA. In the fourth layout area RD, dummy word line transfer transistors can be arranged in one column and one row. In each of the dummy word line transfer transistors, a gate electrode 23D and low concentration impurity diffusion layers 24D and 25D are provided. The low concentration impurity diffusion layer 24D can serve as a drain layer, and the low concentration impurity diffusion layer 25D can serve as a source layer. The dummy word line transfer transistors in the fourth layout area RD can be configured in the same manner as the dummy word line transfer transistors in the second layout area RB.

The outer side of the first layout area RA is located closer to a well 21 than the inner side thereof, and the back bias of a word line transfer transistor can therefore be easily fixed to the substrate potential of 0 V. Therefore, when a high voltage is applied to the drain or the source of a word line transfer transistor, a high electric field is applied between a semiconductor substrate SB and the word line transfer transistor, and the acceleration energy of charge thereby increases. Therefore, the charge is likely to be trapped by a gate insulation film. As a result, deterioration of the threshold voltage and the on-current, that is, shift of the threshold voltage toward a deeper direction and degradation of the on-current are likely to be caused in a word line transfer transistor located on the outer side of the first layout area RA compared a word line transfer transistor located on the inner side thereof.

By providing the fourth layout area RD along the outer periphery of the first layout area RA, and the arranging the dummy word line transfer transistors in the fourth layout area RD, an electric field in the drain or the source of the word line transfer transistor located on the outer side of the first layout area RA can be relaxed. Therefore, it is possible to prevent deterioration of the threshold voltage and the on-current, that is, shift of the threshold voltage toward a deeper direction and degradation of the on-current in the word line transfer transistor located on the outer side of the first layout area RA.

Specifically, as illustrated in FIG. 3, a wiring voltage Vpgm is transferred to control gate electrodes 36 of memory cells of a selected block during data writing. At this time, a transfer gate line TG is biased to Vpgm+Vth. This is because of that, in order to transfer the writing voltage Vpgm without threshold drop, a voltage corresponding to the threshold voltage Vth is to be applied to the gate of the word line transfer transistor in addition to the transfer voltage. The threshold voltage Vth at this point is a threshold voltage of the word line transfer transistor when a back bias corresponding to the writing voltage Vpgm is applied thereto. When the threshold when the writing voltage Vpgm is applied to the drain layer is defined as a threshold during back bias, the lower the threshold voltage Vth during back bias is, the lower a voltage applied to the transfer gate line TG can be made. Therefore, a lower threshold voltage Vth during back bias is preferred in view of the pressure-resistance of the gate insulation film and downsizing and the reliability of a peripheral circuit.

On the other hand, in the case where a back bias is not applied, for example, when a word line voltage that is required for a reading operation of 7 V or lower is transferred, if the threshold is low, leakage current increases. In this case, since drive signal lines CG0 to CGm are shared between a plurality of row decoders 2, when the gate voltage of a word line transfer transistor that is connected to an unselected NAND cell is set to 0 V, it is required to suppress leakage current in the word line direction so as to be, for example, 1 nA or less and 10 PA or more.

Therefore, the word line transfer transistor is designed so as not to reduce the threshold when a back bias is not applied up to a value that causes a problem of leakage while reducing the threshold when applying a back bias.

It is noted that a word line transfer transistor located on the outer side of the first layout area RA is closer to the well 21 than a word line transfer transistor located on the inner side thereof. If a depletion layer generated when a high voltage is applied to the source layer or the drain layer of the word line transfer transistor reaches the well 21, since the well 21 has a higher impurity concentration than the semiconductor substrate SB where the layout area of the word line transfer transistor is provided, the expanse of the depletion layer is restricted. Therefore, the threshold of the word line transfer transistor shifts deeper with respect to a substrate bias.

Furthermore, when a high voltage such as the writing voltage Vpgm and an erasing voltage Ve is applied to the drain layer or the source layer of a word line transfer transistor located on the outer side of the first layout area RA, a depletion layer extends in the deep direction of the semiconductor substrate SB. Also in this case, when a depletion layer reaches the well 21, the extension of the depletion layer is suppressed at this point. As a result, a high electric field is generated in the boundary of the well 21 located under an element isolation region 42. There is concern that electrons obtain high energy due to the high electric field, and thereby reach the gate insulation film of the word line transfer transistor and are trapped therein. This phenomenon can occur in the same manner also in the word line transfer transistor located on the inner side of the first layout area RA. However, the word line transfer transistor is away from the well 21, and therefore hardly affected by the high electric field in the boundary of the well 21.

As described above, when a word line transfer transistor is located close to the well 21, the threshold voltage Vth when applying a back bias becomes deep. In addition, the word line transfer transistor is likely to be influenced by variation in the threshold voltage Vth or a decrease in the on-current Ion caused by a high voltage applied to the drain layer or the source layer thereof. Therefore, when there is no dummy word line transfer transistor, and the threshold voltage Vth when applying a back bias is set in accordance with the word line transfer transistor located on the inner side of the first layout area RA, a sufficient writing voltage Vpgm is not transferred in the word line transfer transistor located on the outer side of the first layout area RA, and writing failure may thereby disadvantageously occur. For example, it is difficult to perform writing up to a sufficiently high threshold of 4 V or more. On the other hand, when there is no dummy word line transfer transistor, and the threshold voltage Vth when applying a back bias is set in accordance with the word line transfer transistor located on the outer side of the first layout area RA, the gate voltage of the word line transfer transistor becomes larger than that in the case where the threshold voltage Vth is set in accordance with the word line transfer transistor located on the inner side of the first layout area RA. However, a smaller gate voltage is preferred in view of the pressure resistant of the gate insulation film and the reliability of a peripheral circuit.

By arranging the dummy word line transfer transistor between the first layout area RA and the well 21, it is possible to prevent the occurrence of writing failure caused by a transferred insufficient writing voltage Vpgm due to the word line transfer transistor located on the outer side of the first layout area RA while reducing a voltage applied to the transfer gate line TG.

Figure 12:
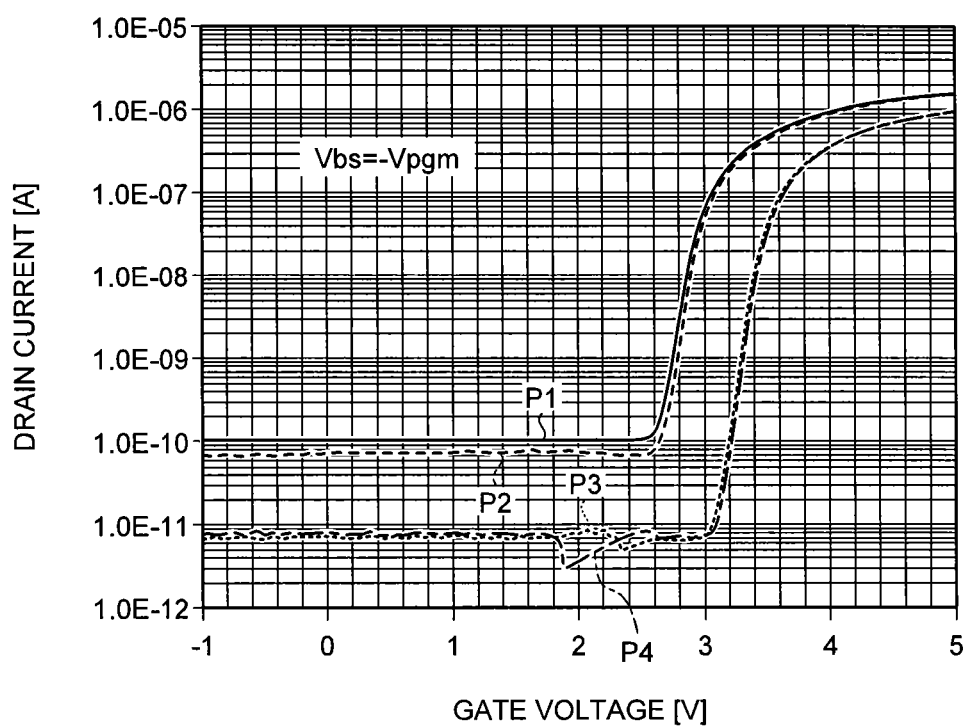
FIG. 12 is a diagram illustrating the relationship between the gate voltage and the drain current of word line transfer transistors when dummy word line transfer transistors of FIG. 11 are not provided by comparing the central part with the outer peripheral part of the word line transfer unit.

FIG. 12 is a diagram illustrating the relationship between the gate voltage and the drain current of word line transfer transistors when the dummy word line transfer transistors of FIG. 11 are not provided by comparing the central part with the outer peripheral part of the word line transfer unit. In the example of FIG. 12, −Vpgm is applied as a back bias voltage Vbs to the word line transfer transistors. In FIG. 12, P1 denotes the relationship between the gate voltage and the drain current of a word line transfer transistor that is located near the center of the first layout area RA; P2 denotes the relationship between the gate voltage and the drain current of a word line transfer transistor that is located on the inner side with respect to the outer periphery of the first layout area RA by one column and one row; P3 denotes the relationship between the gate voltage and the drain current of a word line transfer transistor that is located on the right edge of the outermost periphery of the first layout area RA; and P4 denotes the relationship between the gate voltage and the drain current of a word line transfer transistor that is located on the left edge of the outermost periphery of the first layout area RA.

In FIG. 12, the threshold voltage in the word line transfer transistors located on the outer side of the first layout area RA is deeper than the threshold voltage in the word line transfer transistors located on the inner side of the first layout area RA. On the other hand, the relationship between the gate voltage and the drain current in the word line transfer transistor located on the inner side near the center of the first layout area RA is substantially the same as that in the word line transfer transistor located on the inner side with respect to the outer periphery of the first layout area RA by one column and one row. According to the above, by arranging the dummy word line transfer transistor between the first layout area RA and the well 21, the relationship between the gate voltage and the drain current can be made equal between the word line transfer transistors when transferring the writing voltage Vpgm.

(Fourth Embodiment)

Figure 13:
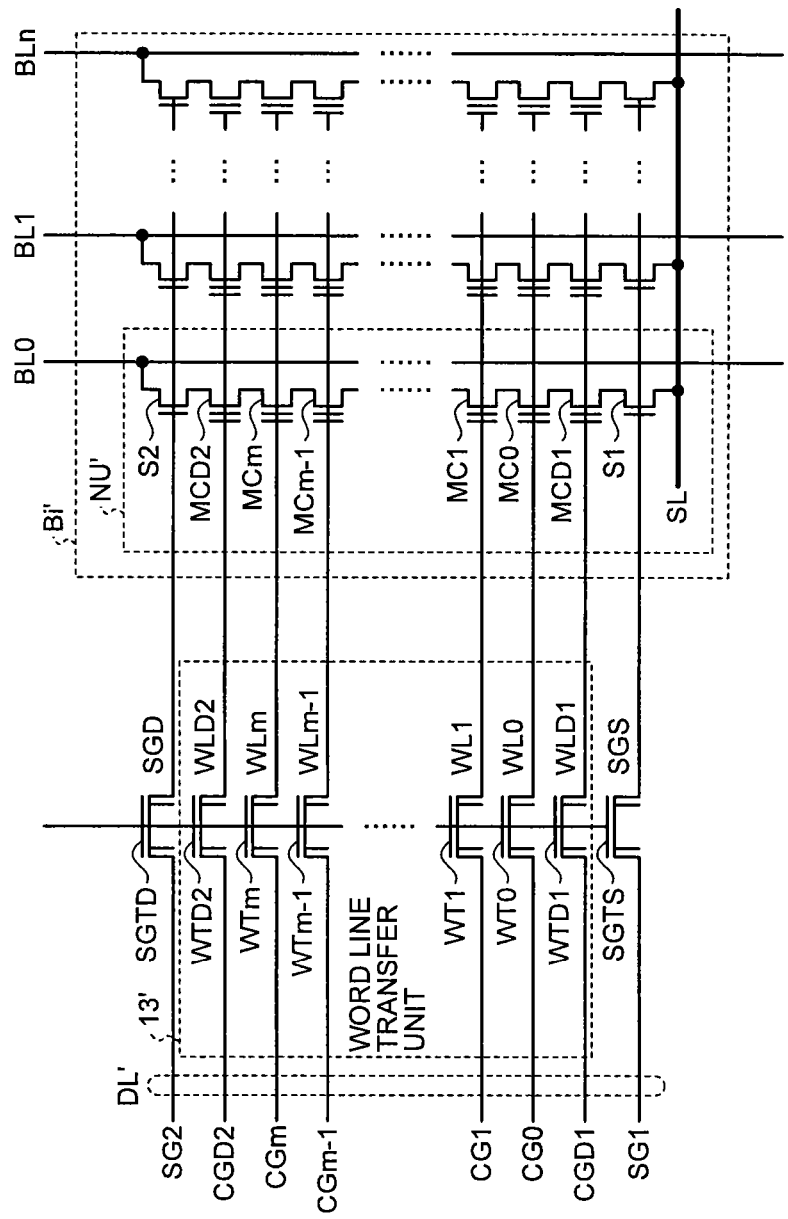
FIG. 13 is a circuit diagram illustrating the schematic configuration of a block and a word line transfer unit which are applied to a nonvolatile semiconductor storage device according to a fourth embodiment.

FIG. 13 is a circuit diagram illustrating the schematic configuration of a block and a word line transfer unit which are applied to a nonvolatile semiconductor storage device according to the fourth embodiment.

In FIG. 13, in the nonvolatile semiconductor storage device, a block Bi' is provided instead of the block Bi of FIG. 2. A NAND cell NU' is provided in the block Bi' instead of the NAND cell NU of FIG. 2. In the block Bi', dummy word lines WLD1 and WLD2 are added to the block Bi of FIG. 2. In the NAND cell NU', dummy cell transistors MCD1 and MCD2 are added to the NAND cell NU. The dummy cell transistors MCD1 and MCD2 can be configured in the same manner as the cell transistors MC0 to MCm. The dummy cell transistors MCD1 and MCD2 are connected to opposite ends of the cell transistors MC0 to MCm. The dummy word lines WLD1 and WLD2 are respectively connected to control gate electrodes of the dummy cell transistors MCD1 and MCD2. It is possible not to use the dummy cell transistors MCD1 and MCD2 in writing and reading of data. By providing the dummy cell transistors MCD1 and MDC2 on the opposite ends of the cell transistors MC0 to MCm, the characteristics of the cell transistors MC0 to MCm can be equalized. More specifically, by providing the dummy cell transistors MCD1 and MDC2 on the opposite ends of the cell transistors MC0 to MCm, it is possible to prevent dimensional deviation of the cell transistors MC0 and MCm arranged on the opposite ends caused by process variation, and prevent deterioration of the characteristics of the cell transistors MC0 and MCm compared to the cell transistors MC1 to MCm-1 arranged on the inner side.

Further, in the nonvolatile semiconductor storage device, a word line transfer unit 13' is provided instead of the word line transfer unit 13 of FIG. 2. In the word line transfer unit 13', word line transfer transistors WTD1 and WTD2 are added to the word line transfer unit 13 of FIG. 2 so as to respectively correspond to the dummy cell transistors MCD1 and MCD2. The word line transfer transistors WTD1 and WTD2 can transfer voltage applied to the dummy cell transistors MCD1 and MCD2 to the dummy word lines WLD1 and WLD2, respectively. In the word line transfer unit 13' of FIG. 13, drive signal lines CGD1 and CGD2 are added so as to respectively correspond to the word line transfer transistors WTD1 and WTD2. Further, in the word line transfer unit 13' of FIG. 13, the dummy word line transfer transistors DWT0 to DWTp of FIG. 2 are removed.

Voltage output from the booster 12 of FIG. 2 is input to the gates of the word line transfer transistors WTD1 and WTD2. The dummy word line WLD1 and WLD2 are respectively connected to the sources of the word line transfer transistors WTD1 and WTD2. The drive signal lines CGD1 and CGD2 are respectively connected to the drains of the word line transfer transistors WTD1 and WTD2. A drive signal DL' is input to the word line transfer unit 13' through the drive signal lines CG0 to CGm, CGD1, and CGD2.

In the example of FIG. 13, the case where the single dummy cell transistor MCD1 and the single dummy cell transistor MCD2 are provided on the opposite ends of the cell transistors MC0 to MCm has been described. However, two or more dummy cell transistors may be provided on one end or each end of the cell transistors MC0 to MCm. In this case, word line transfer transistors can be added so as to correspond to these dummy cell transistors.

Figure 14:
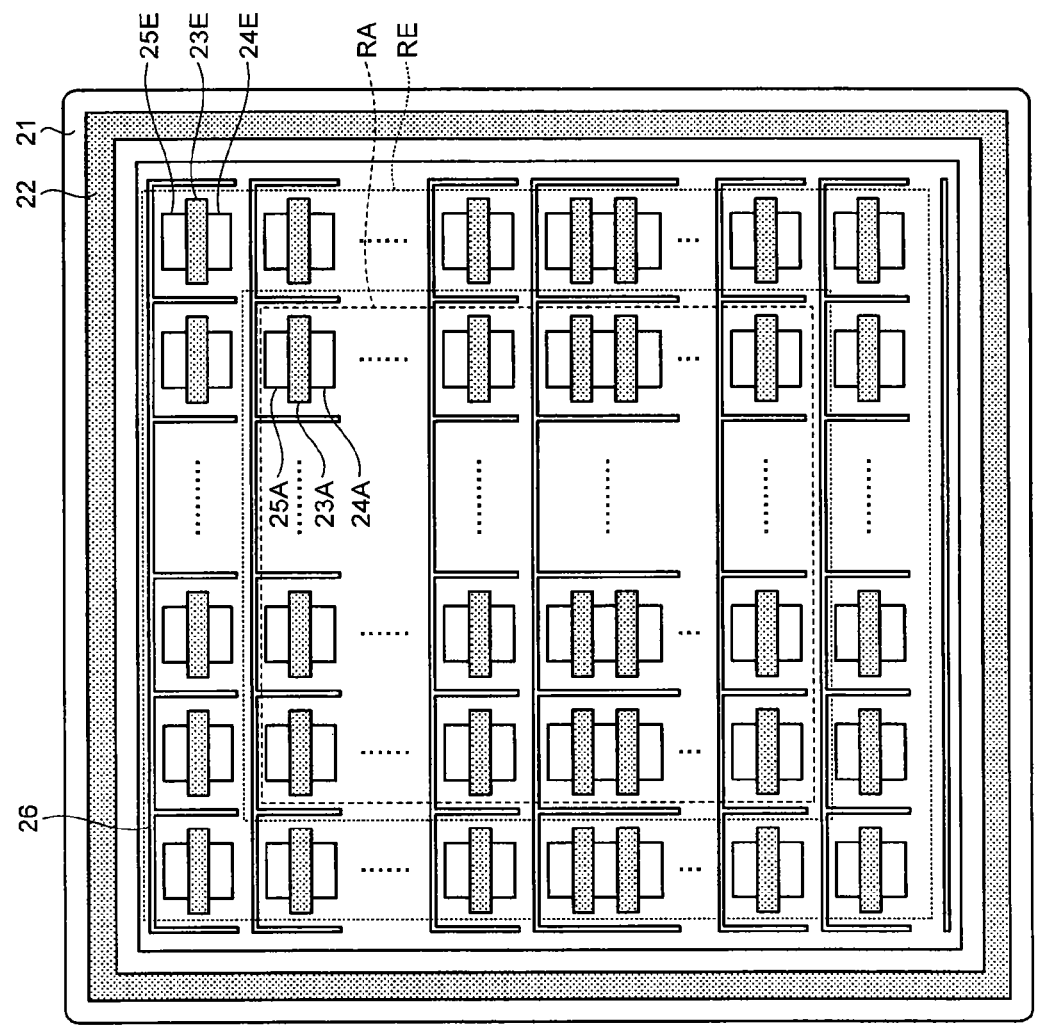
FIG. 14 is a plan view illustrating an example of the layout of the word line transfer unit of FIG. 13.

FIG. 14 is a plan view illustrating an example of the layout of the word line transfer unit of FIG. 13.

In FIG. 14, in the layout area of the word line transfer unit, a fifth layout area RE is provided instead of the fourth layout area RD of FIG. 11. The fifth layout area RE is arranged along the outer periphery of a first layout area RA. In the fifth layout area RE, word line transfer transistors WTD1 and WTD2 can be arranged in one column and one row. In each of the word line transfer transistors WTD1 and WTD2, a gate electrode 23E and low concentration impurity diffusion layers 24E and 25E are provided. The low concentration impurity diffusion layer 24E can serve as a drain layer, and the low concentration impurity diffusion layer 25E can serve as a source layer. The word line transfer transistors WTD1 and WTD2 in the fifth layout area RE can be configured in the same manner as the word line transfer transistors WT0 to WTm in the first layout area RA.

The word line transfer transistors WTD1 and WTD2 in the fifth layout area RE can be used in the dummy cell transistors MCD1 and MCD2. The word line transfer transistors WT0 to WTm in the first layout area RA can be used in the cell transistors MC0 to MCm. Accordingly, it is possible to prevent the word line transfer transistors used in the cell transistors MC0 to MCm from being arranged adjacent to a well 21. Therefore, electric fields in the drains or the sources of the word line transfer transistors used in the cell transistors MC0 to MCm can be relaxed. As a result, shift of the threshold voltage toward a deeper direction and deterioration of the on-current can be prevented.

A writing voltage Vpgm of, for example, 20 V or more and 30 V or less is not transferred to the dummy word lines WLD1 and WLD2, and a lower voltage of, for example, 0 V or more and 20 V or less is transferred thereto. Therefore, it is possible to maintain an increase in the threshold when applying a back bias low. Further, a sufficient voltage can be transferred even when the word line transfer transistors WTD1 and WTD2 are arranged adjacent to the well 21.

Figure 15:
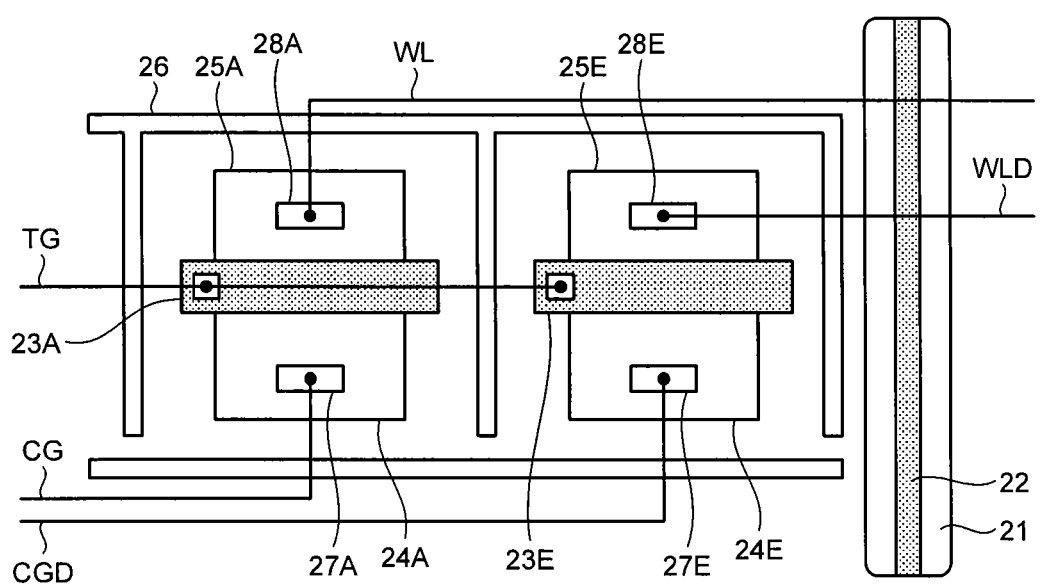
FIG. 15 is a plan view illustrating an example of connection of word line transfer transistors of the word line transfer unit of FIG. 14.

FIG. 15 is a plan view illustrating an example of connection of the word line transfer transistors of the word line transfer unit of FIG. 14.

In FIG. 15, a gate electrode 23A and low concentration impurity diffusion layers 24A and 25A are provided in each of the word line transfer transistors WT0 to WTm. High impurity diffusion layers 27A and 28A are respectively formed on the low concentration impurity diffusion layers 24A and 25A. The high concentration impurity diffusion layer 27A is connected to a drive signal line CG. The high concentration impurity diffusion layer 28A is connected to a word line WL. The gate electrode 23A is connected to a transfer gate line TG.

In each of the word line transfer transistors WTD1 and WTD2, a gate electrode 23E and low concentration impurity diffusion layers 24E and 25E are provided. High concentration impurity diffusion layers 27E and 28E are respectively formed on the low concentration impurity diffusion layers 24E and 25E. The high concentration impurity diffusion layer 27E is connected to a drive signal line CGD. The high concentration impurity diffusion layer 28E is connected to a dummy word line WLD. The gate electrode 23E is connected to the transfer gate line TG.

In the fourth embodiment, the example in which the fifth layout area RE is provided along the outer periphery of the first layout area RA, and the word line transfer transistors WTD1 and WTD2 are arranged in the fifth layout area has been described. However, as illustrated in FIG. 5, the fifth layout area RE may be provided only between the first layout area RA and the memory cell array 1, and the word line transfer transistors WTD1 and WTD2 may be arranged therein. Further, as illustrated in FIG. 10, the fifth layout area RE may also be provided on the opposite side of the memory cell array 1 with the first layout area RA interposed therebetween, and the word line transfer transistors WTD1 and WTD2 may be arranged therein.

(Fifth Embodiment)

Figure 16:
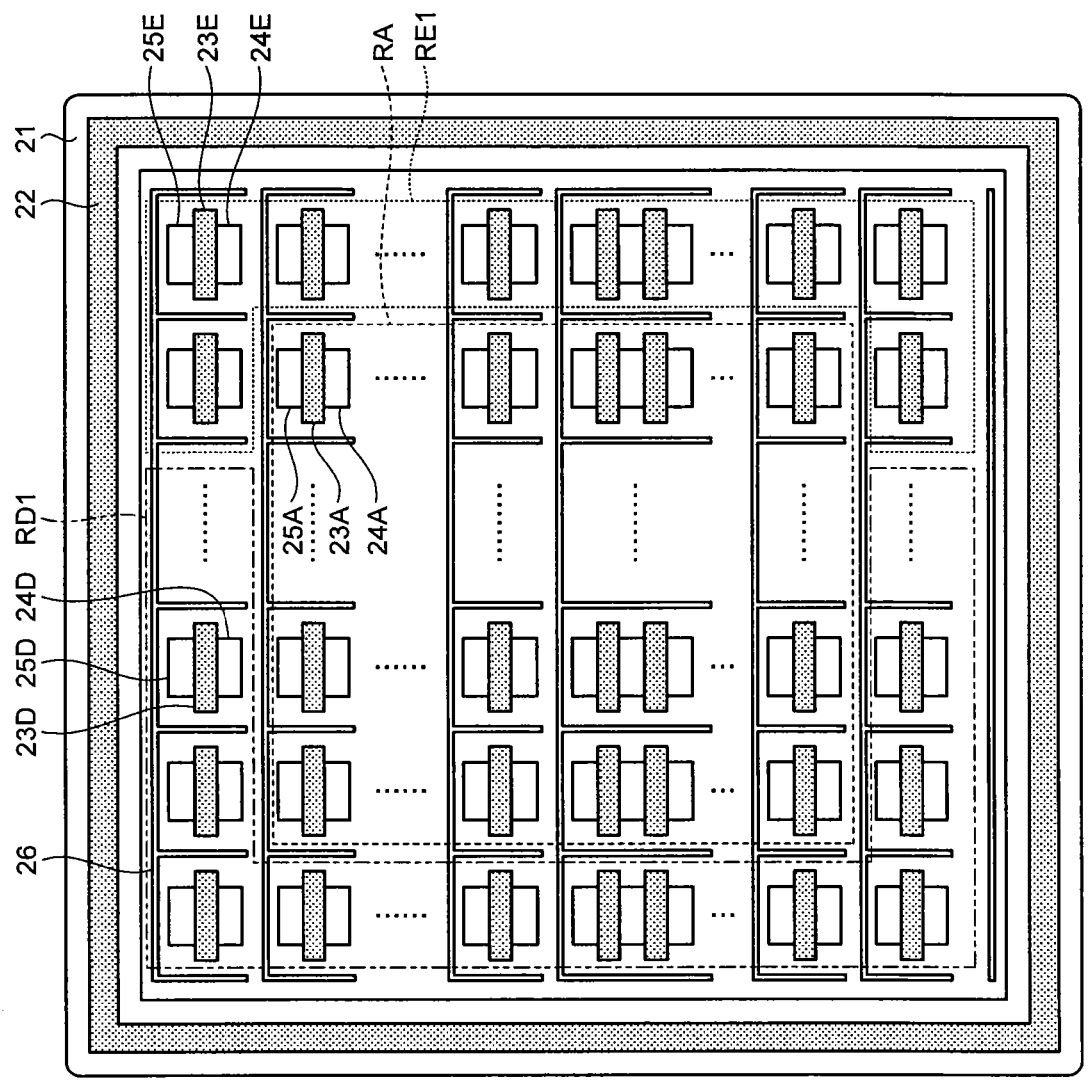
FIG. 16 is a plan view illustrating an example of the layout of a word line transfer unit which is applied to a nonvolatile semiconductor storage device according to a fifth embodiment.

FIG. 16 is a plan view illustrating an example of the layout of a word line transfer unit which is applied to a nonvolatile semiconductor storage device according to the fifth embodiment.

In FIG. 16, in the layout area of the word line transfer unit, a sixth layout area RE1 and a seventh layout area RD1 are provided instead of the fifth layout area RE of FIG. 15. The sixth layout area RE1 and the seventh layout area RD1 are arranged along the outer periphery of a first layout area RA. In this case, the outer periphery of the first layout area RA can be divided, and the sixth layout area RE1 can be arranged in one divided part and the seventh layout area RD1 can be arranged in the other divided part. Word line transfer transistors WTD1 and WTD2 can be arranged in the sixth layout area RE1, and dummy word line transfer transistors DWT0 to DWTp can be arranged in the seventh layout area RD1. The number of word line transfer transistors WTD1 and WTD2 arranged in the sixth layout area RE1 can be made equal to the number of dummy cell transistors MCD1 and MCD2. Accordingly, it is possible to prevent word line transfer transistors used in cell transistors MC0 to MCm from being arranged adjacent to a well 21 while setting the sixth layout area RE1 so as to correspond to the number of dummy cell transistors MCD1 and MCD2. Therefore, electric fields in the drains or the sources of the word line transfer transistors used in the cell transistors MC0 to MCm can be relaxed. As a result, shift of the threshold voltage toward a deeper direction and deterioration of the on-current can be prevented.

In the fifth embodiment, the sixth layout area RE1 and the seventh layout area RD1 are arranged along the outer periphery of the first layout area RA. However, in the same manner as in the fourth embodiment described above, the sixth layout area RE1 and the seventh layout area RD1 may be provided only between the first layout area RA and the memory cell array 1. Further, in addition to this, the sixth layout area RE1 and the seventh layout area RD1 may be provided also on the opposite side of the memory cell array 1.

(Sixth Embodiment)

Figure 17:
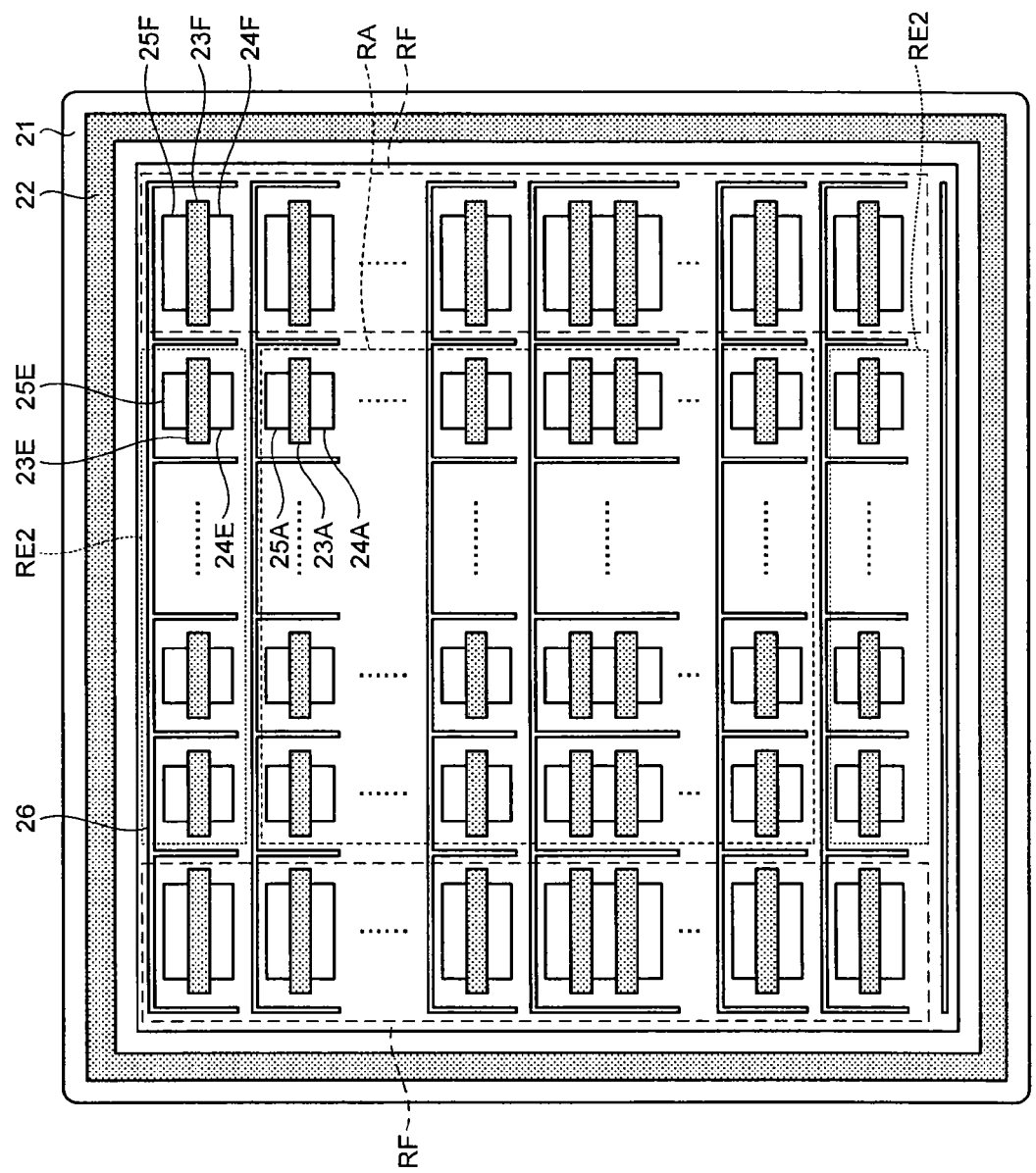
FIG. 17 is a plan view illustrating an example of the layout of a word line transfer unit which is applied to a nonvolatile semiconductor storage device according to a sixth embodiment.

FIG. 17 is a plan view illustrating an example of the layout of a word line transfer unit which is applied to a nonvolatile semiconductor storage device according to the sixth embodiment.

In FIG. 17, in the layout area of the word line transfer unit, an eighth layout area RE2 and a ninth layout area RF are provided instead of the fifth layout area RE of FIG. 14. In the eighth layout area RE2, one row of word line transfer transistors WTD1 and WTD2 can be arranged along each of upper and lower ends of a first layout area RA. In the ninth layout area RF, one column of word line transfer transistors WT0 to WTm can be arranged along each of right and left ends of the first layout area RA.

In each of the word line transfer transistors WT0 to WTm in the ninth layout area RF, a gate electrode 23F and low concentration impurity diffusion layers 24F and 25F are provided. The gate electrode 23F and the low concentration impurity diffusion layers 24F and 25F of each of the word line transfer transistors WT0 to WTm in the ninth layout area RF are expanded in the channel width direction compared to a gate electrode 23A and low concentration impurity diffusion layers 24A and 25A of each of word line transfer transistors WT0 to WTm in the first layout area RA. By expanding the channel width of the word line transfer transistors WT0 to WTm, it is possible to reduce the threshold voltage when applying a back bias. Therefore, even when the word line transfer transistors WT0 to WTm used in cell transistors MC0 to MCm are arranged adjacent to a well 21, it is possible to prevent shift of the threshold voltage toward a deeper direction and degradation of the on-current.

Further, by arranging the word line transfer transistors WTD1 and WTD2 in the eighth layout area RE2, it is possible to prevent word line transfer transistors which are arranged on upper and lower ends of the first layout area RA and used in the cell transistors MC0 to MCm from being arranged adjacent to the well 21. As a result, it is possible to prevent shift of the threshold voltage toward a deeper direction and degradation of the on-current.

Figure 18:
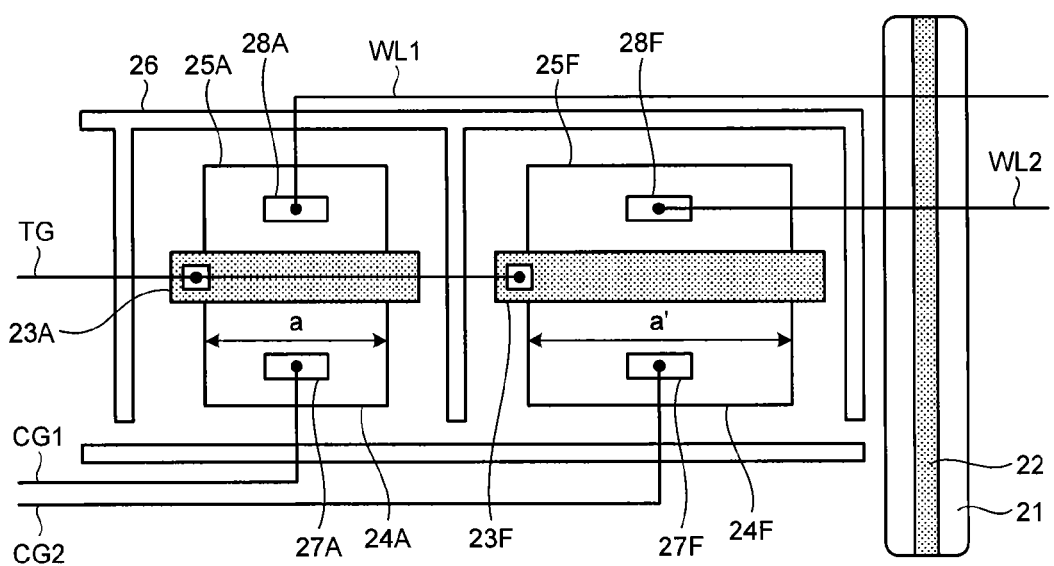
FIG. 18 is a plan view illustrating an example of connection of word line transfer transistors of the word line transfer unit of FIG. 17.

FIG. 18 is a plan view illustrating an example of connection of the word line transfer transistors of the word line transfer unit of FIG. 17.

In FIG. 18, the gate electrode 23A, and the low concentration impurity diffusion layers 24A and 25A are provided in each of the word line transfer transistors WT0 to WTm in the first layout area RA. High concentration impurity diffusion layers 27A and 28A are respectively formed on the low concentration impurity diffusion layers 24A and 25A. The high concentration impurity diffusion layer 27A is connected to a drive signal line CG1. The high concentration impurity diffusion layer 28A is connected to a word line WL1. The gate electrode 23A is connected to a transfer gate line TG.

The gate electrode 23F, and the low concentration impurity diffusion layers 24F and 25F are provided in each of the word line transfer transistors WT0 to WTm in the ninth layout area RF. High concentration impurity diffusion layers 27F and 28F are respectively formed on the low concentration impurity diffusion layers 24F and 25F. The high concentration impurity diffusion layer 27F is connected to a drive signal line CG2. The high concentration impurity diffusion layer 28F is connected to a word line WL2. The gate electrode 23F is connected to the transfer gate line TG.

The channel width of the word line transfer transistors WT0 to WTm in the first layout area RA is set to a, and the channel width of the word line transfer transistors WT0 to WTm in the ninth layout area RF is set to a' (a'>a). For example, a' can be made larger than a by 0.1 μm or more and 2.0 μm or less.

Figure 19:
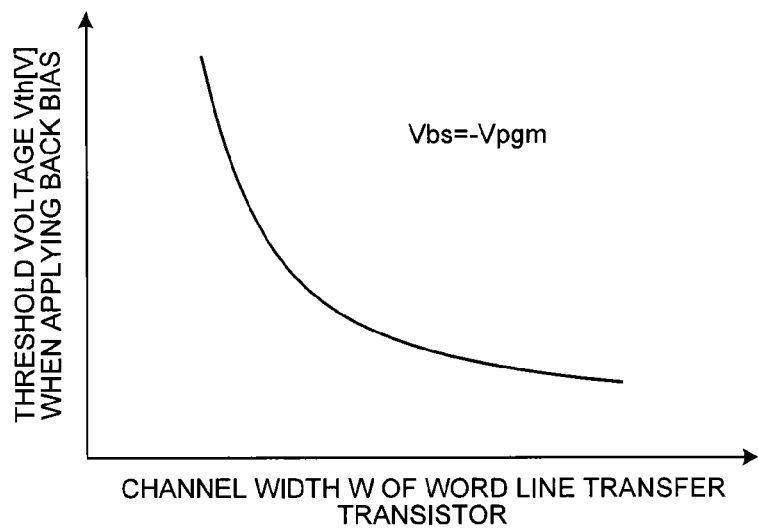
FIG. 19 is a diagram illustrating the relationship between the channel width and the threshold voltage of the word line transfer transistors of FIG. 18.

FIG. 19 is a diagram illustrating the relationship between the channel width and the threshold voltage of the word line transfer transistors of FIG. 18.

In FIG. 19, when a back bias voltage Vbs satisfies a relationship of Vbs=−Vpgm, the larger the channel width W of a word line transfer transistor is, the smaller the threshold voltage Vth when applying a back bias becomes. This is because of that, since a P-type impurity (boron, for example) in the range of $10^{15}$ cm$^{-3}$ to $10^{17}$ cm$^{-3}$ is injected into the lower side or the side wall of an element isolation region 42 in order to prevent punch-through leakage through the element isolation region 42, the threshold becomes high on the ends of the channel width. Therefore, in a word line transfer transistor having an expanded channel width W, the threshold voltage Vth becomes small. Therefore, a difference in the threshold voltage Vth between the word line transfer transistors WT0 to WTm in the ninth layout area RF and the word line transfer transistors WT0 to WTm in the first layout area RA can be made small. In addition, by expanding the channel width W, deterioration of the characteristics when applying a high voltage to the impurity diffusion layers can also be made small. As a result, even when the word line transfer transistors WT0 to WTm in the ninth layout area RF are adjacent to the well 21, writing failure can be reduced.

In the sixth embodiment described above, the example in which the word line transfer transistors WTD1 and WTD2 are arranged in the eighth layout area RE2 has been described. However, dummy word line transfer transistors DWT0 to DWTp may be arranged in the eighth layout area RE2. Alternatively, in the eighth layout area RE2, the word line transfer transistors WTD1 and WTD2 and the dummy word line transfer transistors DWT0 to DWTp may be provided in a mixed fashion.

(Seventh Embodiment)

Figure 20:
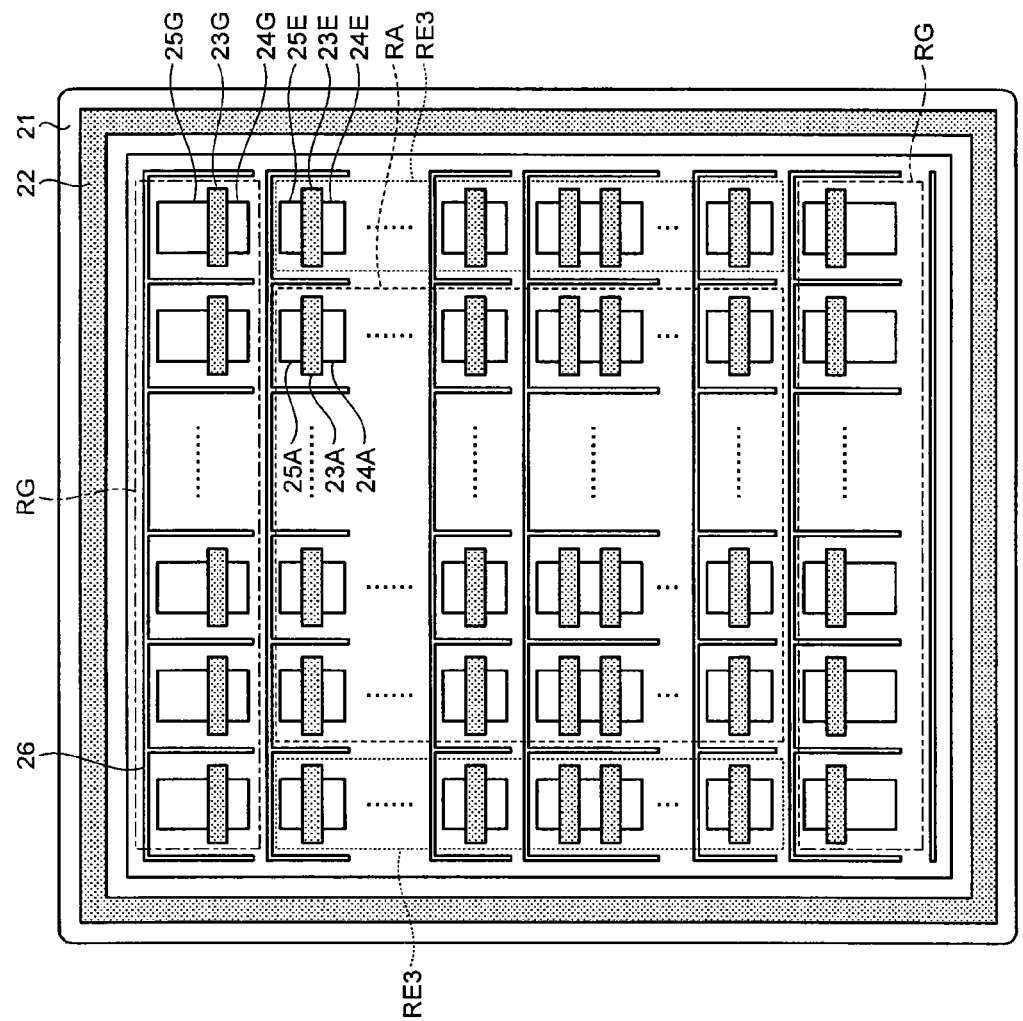
FIG. 20 is a plan view illustrating an example of the layout of a word line transfer unit which is applied to a nonvolatile semiconductor storage device according to a seventh embodiment.

FIG. 20 is a plan view illustrating an example of the layout of a word line transfer unit which is applied to a nonvolatile semiconductor storage device according to the seventh embodiment In FIG. 20, in the layout area of the word line transfer unit, a tenth layout area RE3 and an eleventh layout area RG are provided instead of the fifth layout area RE of FIG. 14. In the tenth layout area RE3, one column of word line transfer transistors WTD1 and WTD2 can be arranged along each of right and left ends of a first layout area RA. In the eleventh layout area RG, one row of word line transfer transistors WT0 to WTm can be arranged along each of upper and lower ends of the first layout area RA.

In each of the word line transfer transistors WT0 to WTm in the eleventh layout area RG, a gate electrode 23G and low concentration impurity diffusion layers 24G and 25G are provided. The low concentration impurity diffusion layers 24G and 25G of each of the word line transfer transistors WT0 to WTm in the eleventh layout area RG at the side facing a well 21 are expanded in the channel length direction compared to low concentration impurity diffusion layers 24A and 25A of each of word line transfer transistors WT0 to WTm in the first layout area RA. By expanding the low concentration impurity diffusion layers 24G and 25G of each of the word line transfer transistors WT0 to WTm at the side facing the well 21 in the channel length direction, it is possible to reduce fluctuation of the threshold voltage when applying a back bias. Therefore, even when word line transfer transistors WT0 to WTm used in cell transistors MC0 to MCm are arranged adjacent to the well 21, it is possible to prevent shift of the threshold voltage toward a deeper direction and degradation of the on-current.

Further, by arranging the word line transfer transistors WTD1 and WTD2 in the tenth layout area RE3, it is possible to prevent word line transfer transistors which are arranged on right and left ends of the first layout area RA and used in the cell transistors MC0 to MCm from being arranged adjacent to the well 21. As a result, it is possible to prevent shift of the threshold voltage toward a deeper direction and degradation of the on-current.

Figure 21:
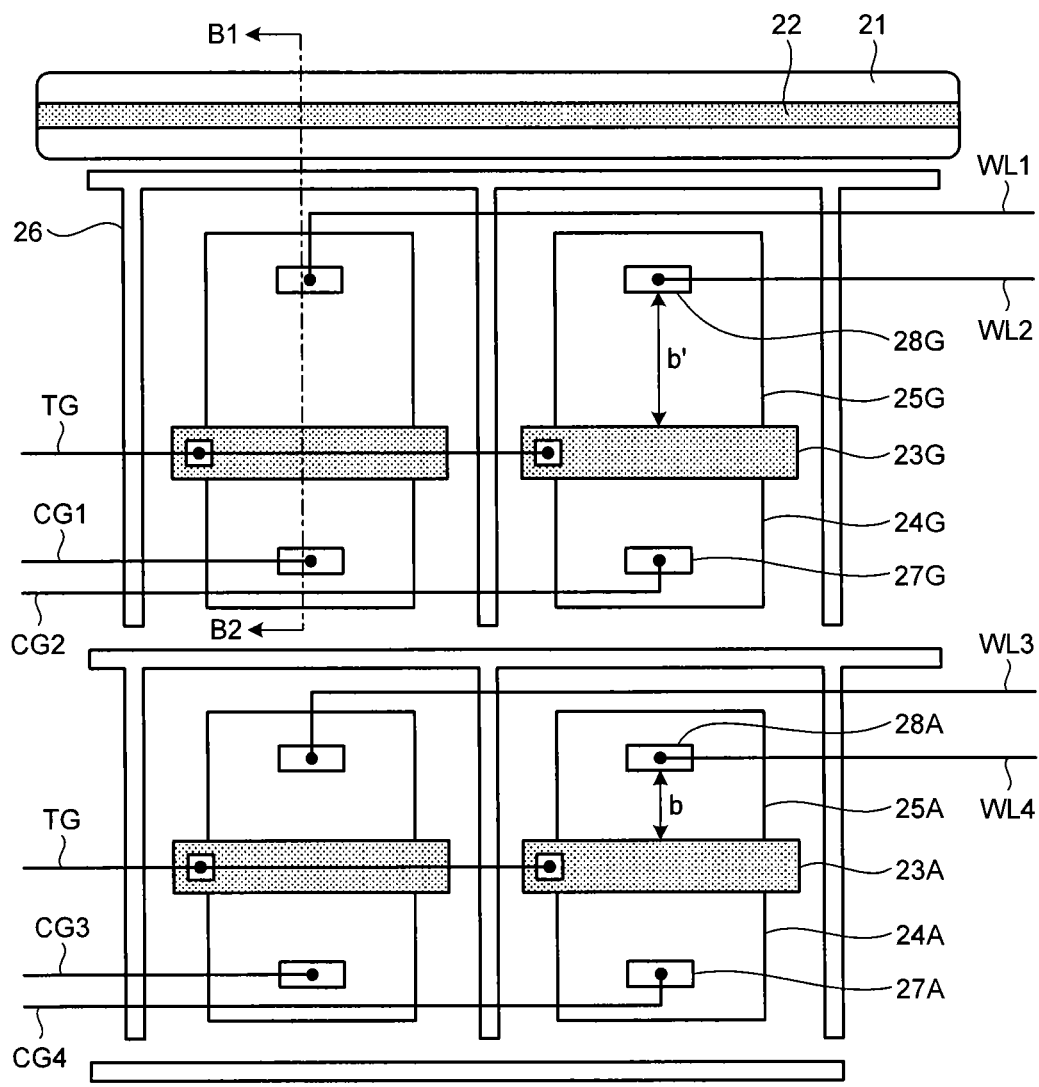
FIG. 21 is a plan view illustrating an example of connection of word line transfer transistors of the word line transfer unit of FIG. 20.

FIG. 21 is a plan view illustrating an example of connection of the word line transfer transistors of the word line transfer unit of FIG. 20.

In FIG. 21, the gate electrode 23A, and the low concentration impurity diffusion layers 24A and 25A are provided in each of the word line transfer transistors WT0 to WTm in the first layout area RA. High concentration impurity diffusion layers 27A and 28A are respectively formed on the low concentration impurity diffusion layers 24A and 25A. The high concentration impurity diffusion layer 27A in each of the word line transfer transistors is connected to a drive signal line CG3 or CG4. The high concentration impurity diffusion layer 28A in each of the word line transfer transistors is connected to a word line WL3 or WL4. The gate electrode 23A in each of the word line transfer transistors is connected to a transfer gate line TG in common.

The gate electrode 23G, and the low concentration impurity diffusion layers 24G and 25G are provided in each of the word line transfer transistors WT0 to WTm in the eleventh layout area RG. High concentration impurity diffusion layers 27G and 28G are respectively formed on the low concentration impurity diffusion layers 24G and 25G. The high concentration impurity diffusion layer 27G in each of the word line transfer transistors is connected to a drive signal line CG1 or CG2. The high concentration impurity diffusion layer 28G in each of the word line transfer transistors is connected to a word line WL1 or WL2. The gate electrode 23G in each of the word line transfer transistors is connected to a transfer gate line TG in common.

In each of the word line transfer transistors WT0 to WTm in the first layout area RA, the distance in the channel length direction between the high concentration impurity diffusion layer 28A located at the side facing the well 21 and the gate electrode 23A is set to b. In each of the word line transfer transistors WT0 to WTm in the eleventh layout area RG, the distance in the channel length direction between the high concentration impurity diffusion layer 28G located at the side facing the well 21 and the gate electrode 23G is set to b' (b'>b). For example, b' can be made larger than b by 0.1 μm or more and 1.5 μm or less.

Figure 22:
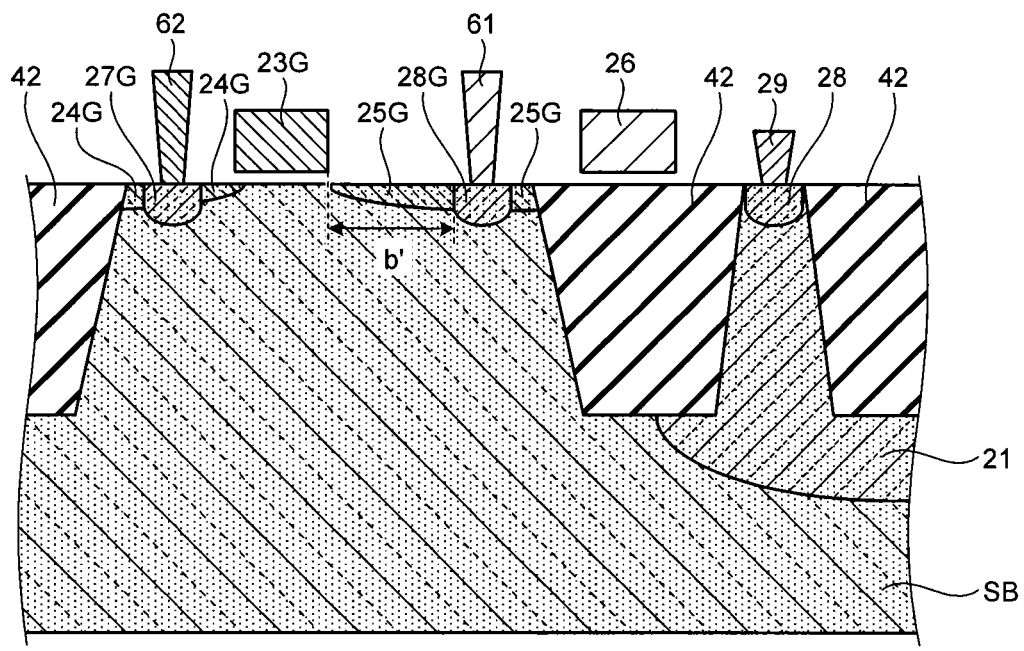
FIG. 22 is a cross-sectional view taken along line B1-B2 of FIG. 21.

FIG. 22 is a cross-sectional view taken along line B1-B2 of FIG. 21.

In FIG. 22, the well 21 and an element isolation region 42 are formed on a semiconductor substrate SB. Further, the low concentration impurity diffusion layers 24G and 25G are formed on the semiconductor substrate SB. The high concentration impurity diffusion layers 27G and 28G are respectively formed on the low concentration impurity diffusion layers 24G and 25G. The low concentration impurity diffusion layers 24G and 25G can be set to N type. The high concentration impurity diffusion layers 27G and 28G can be set to N$^+$ type. Contact plugs 62 and 61 are respectively formed on the high concentration impurity diffusion layers 27G and 28G. The distance in the channel length direction between the high concentration impurity diffusion layer 28G which is located closer to the well 21 and the gate electrode 23G is set to b'.

By making the distance in the channel length direction between the high concentration impurity diffusion layer 28G located closer to the well 21 and the gate electrode 23G large, the distance between a channel region of the word line transfer transistor and the well 21 becomes large. Therefore, since the P type impurity concentration of the semiconductor substrate SB is seen low compared to the case where the distance in the channel length direction between the high concentration impurity diffusion layer 28G located closer to the well 21 and the gate electrode 23G is small, it is possible to reduce fluctuation of the threshold voltage Vth when applying a back bias voltage. In other words, a difference in threshold when applying a back bias voltage between a word line transfer transistor located on the inner side of the layout area of the word line transfer unit and a word line transfer transistor located close to the well 21 can be made small. Further, by making the distance in the channel length direction between the high concentration impurity diffusion layer 28G located closer to the well 21 and the gate electrode 23G large, charges that are trapped by a gate insulation film of the word line transfer transistor when a high voltage is applied to the high concentration impurity diffusion layer 28G are reduced. As a result, it is possible to reduce deterioration of the transistor characteristics.

In the seventh embodiment described above, the example in which the word line transfer transistors WTD1 and WTD2 are arranged in the tenth layout area RE3 has been described. However, dummy word line transfer transistors DWT0 to DWTp may be arranged in the tenth layout area RE3. Alternatively, in the tenth layout area RE3, the word line transfer transistors WTD1 and WTD2 and the dummy word line transfer transistors DWT0 to DWTp may be mixedly provided.

(Eighth Embodiment)

Figure 23:
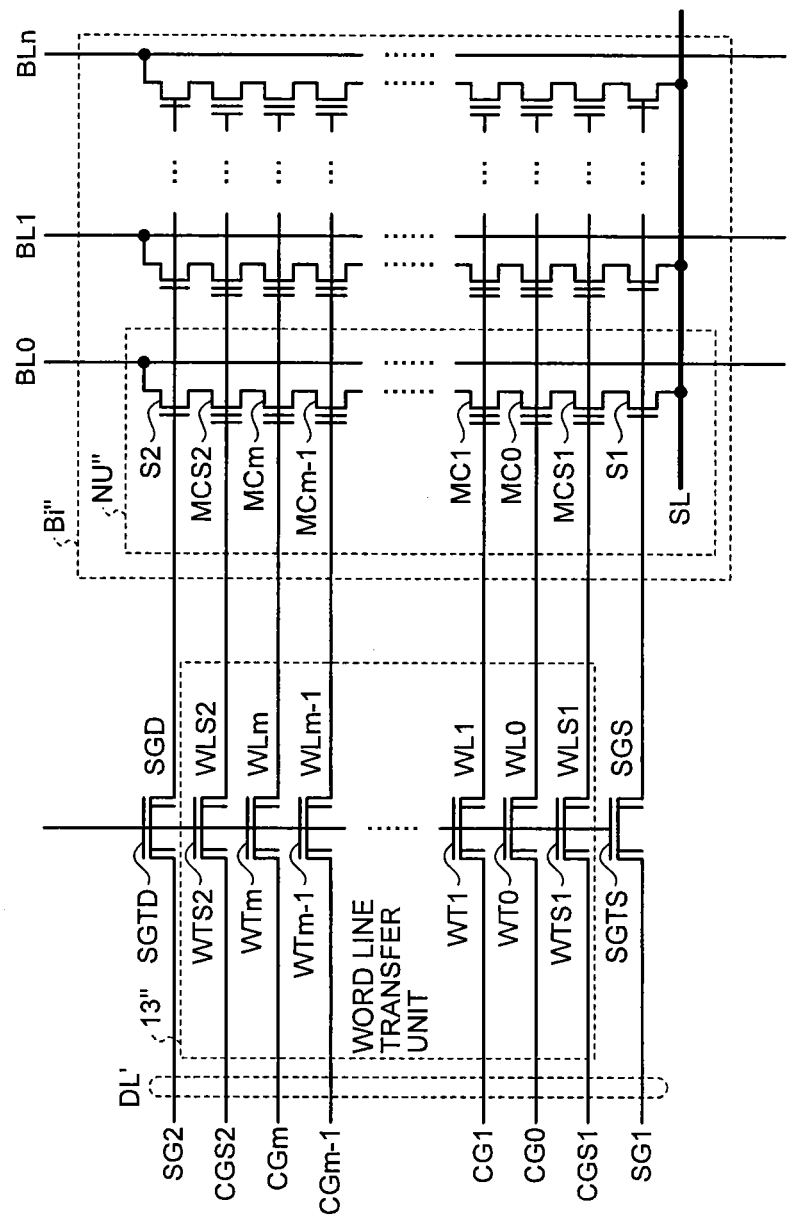
FIG. 23 is a circuit diagram illustrating the schematic configuration of a block and a word line transfer unit which are applied to a nonvolatile semiconductor storage device according to an eighth embodiment.

FIG. 23 is a circuit diagram illustrating the schematic configuration of a block and a word line transfer unit which are applied to a nonvolatile semiconductor storage device according to the eighth embodiment.

In the fourth to seventh embodiments described above, the example in which the dummy cell transistors MCD1 and MCD2 that are not used for storing data are arranged on the opposite ends of the NAND cell NU' has been described. However, the cell transistors MC0 to MCm may be used for storing multi-level data of three or more values, and cell transistors of a memory cell used for storing binary-level data may be arranged on the opposite ends of the NAND cell NU' instead of the dummy cell transistors MCD1 and MCD2.

In FIG. 23, in the nonvolatile semiconductor storage device, a block Bi" is provided instead of the block Bi' of FIG. 13. In the block Bi", a NAND cell NU" is provided instead of the NAND cell NU' of FIG. 13. In the NAND cell NU", cell transistors MCS1 and MCS2 are provided instead of the dummy cell transistors MCD1 and MCD2 of the NAND cell NU'. Cell transistors MC0 to MCm of the NAND cell NU" can store multi-level data of three or more values. The cell transistors MCS1 and MCS2 can store binary-level data.

Further, in the nonvolatile semiconductor storage device, a word line transfer unit 13" is provided instead of the word line transfer unit 13' of FIG. 13. In the word line transfer unit 13", word line transfer transistors WTS1 and WTS2 are provided instead of the word line transfer transistors WTD1 and WTD2 of the word line transfer unit 13' of FIG. 13. The word line transfer transistors WTS1 and WTS2 can transfer voltage applied to the cell transistors MCS1 and MCS2 to word lines WLS1 and WLS2, respectively. Further, in the word line transfer unit 13" of FIG. 23, drive signal lines CGS1 and CGS2 are provided instead of the drive signal lines CGD1 and CGD2 of the word line transfer unit 13' of FIG. 13.

Voltage output from the booster 12 of FIG. 2 is input to the gates of the word line transfer transistors WTS1 and WTS2. The word lines WLS1 and WLS2 are respectively connected to the sources of the word line transfer transistors WTS1 and WTS2. Drive signal lines CGS1 and CGS2 are respectively connected to the drains of the word line transfer transistors WTS1 and WTS2.

The word line transfer transistors WTS1 and WTS2 can be arranged in the same layout area as the word line transfer transistors WTD1 and WTD2 of FIG. 13. When storing binary-level data in the cell transistors MCS1 and MCS2, it is not necessary to control the threshold up to a high threshold voltage compared to the case where multi-level data of three or more values is stored in the cell transistors MC0 to MCm, and writing and reading of data can be performed by transferring a voltage that is lower than a voltage in the case of the cell transistors MC0 to MCm, for example, in the range of 0 V to 20 V. Therefore, even when the word line transfer transistors WTS1 and WTS2 used in the cell transistors MCS1 and MCS2 are arranged adjacent to the well 21, it is possible to maintain an increase in the threshold when applying a back bias voltage low, thereby transferring a sufficient voltage.

Further, a NAND cell may be configured in such a manner that dummy cell transistors are connected to opposite ends of a cell transistor that stores multi-level data through cell transistors that store binary-level data, and word line transfer transistors used in the dummy cell transistors and word line transfer transistors used in the cell transistors of a binary-level memory cell may be arranged adjacent to the well 21.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
   a memory cell array including electrically writable and erasable memory cells arranged in a matrix form in a row direction and a column direction;
   a word line that transmits voltage applied to the memory cells in the row direction; and
   a word line transfer unit that transfers voltage applied to a memory cell selected on the basis of an address to the word line, the word line transfer unit including:
      at least one word line transfer transistor that transfers voltage applied to the memory cells to the word line, and
      at least one dummy word line transfer transistor that does not transfer voltage to a gate of another transistor.

2. The nonvolatile semiconductor storage device according to claim 1, wherein
   the word line transfer transistor is arranged in a first layout area of the word line transfer unit, and
   the dummy word line transfer transistor is arranged in a second layout area provided outside an end of the first layout area.

3. The nonvolatile semiconductor storage device according to claim 2, wherein the second layout area is provided between the first layout area and the memory cell array.

4. The nonvolatile semiconductor storage device according to claim 3, wherein the at least one word line transfer transistor is arranged in an array form of X column(s) x Y row(s) (X, Y are positive integers), and the at least one dummy word line transfer transistor is arranged in one column x Y row(s).

5. The nonvolatile semiconductor storage device according to claim 3, wherein the second layout area is also provided on an opposite side of the memory cell array with the first layout area interposed therebetween.

6. The nonvolatile semiconductor storage device according to claim 2, wherein the second layout area is arranged along an outer periphery of the first layout area.

7. The nonvolatile semiconductor storage device according to claim 6, wherein a well is provided along an outer periphery of the second layout area, the well having a higher impurity concentration than a substrate portion in which the first layout area and the second layout area are arranged.

8. The nonvolatile semiconductor storage device according to claim 2, wherein the second layout area is provided in the row direction along the end of the first layout area, and an expanded word line transfer transistor having a larger channel width than the at least one word line transfer transistor arranged in the first layout area is arranged in a third layout area provided in the column direction along the end of the first layout area.

9. The nonvolatile semiconductor storage device according to claim 2, wherein the second layout area is provided in the column direction along the end of the first layout area, and an expanded word line transfer transistor having a longer distance in a channel length direction between an impurity diffusion layer connected to the word line and a gate electrode than the at least one word line transfer transistor arranged in the first layout area is arranged in a third layout area provided in the row direction along the end of the first layout area.

10. The nonvolatile semiconductor storage device according to claim 1, wherein a drain and a source of the dummy word line transfer transistor have a common potential.

11. A nonvolatile semiconductor storage device comprising:
    a semiconductor substrate;
    an impurity diffusion layer that supplies a voltage to the semiconductor substrate;
    a well that includes the impurity diffusion layer;
    a memory cell array including electrically writable and erasable memory cells arranged in a matrix form in a row direction and a column direction;
    a word line that transmits voltage applied to the memory cells in the row direction;
    a word line transfer unit that transfers voltage applied to a memory cell selected on the basis of an address to the word line; and a dummy word line that transfers voltage applied to dummy memory cells in the row direction, the dummy memory cells being provided in the memory cell array, the word line transfer unit including:

a first word line transfer transistor that is arranged in a first layout area of the word line transfer unit and transfers voltage applied to the memory cells to the word line, and a second word line transfer transistor that is arranged in a second layout area provided outside an end of the first layout area and transfers voltage applied to the dummy memory cells to the dummy word line, wherein the second layout area borders the impurity diffusion layer, and the well circumscribes an outer periphery of the first layout area and the second layout area, the well having a higher impurity concentration than the semiconductor substrate in which the first layout area and the second layout area are arranged, and the well not including the first word line transfer transistor and the second word line transfer transistor.

12. The nonvolatile semiconductor storage device according to claim 11, wherein the second layout area is provided between the first layout area and the memory cell array.

13. The nonvolatile semiconductor storage device according to claim 12, wherein the second layout area is also provided on an opposite side of the memory cell array with the first layout area interposed therebetween.

14. The nonvolatile semiconductor storage device according to claim 11, wherein the second layout area is arranged along an outer periphery of the first layout area.

15. The nonvolatile semiconductor storage device according to claim 11, wherein a dummy word line transfer transistor which does not transfer voltage applied to the memory cells or the dummy memory cells to the word line or the dummy word line is arranged in a third layout area provided outside the end of the first layout area, the dummy word line transfer transistor being continuously disconnected from the memory cell array.

16. The nonvolatile semiconductor storage device according to claim 11, wherein the second layout area is provided in the row direction along the end of the first layout area, and an expanded word line transfer transistor having a larger channel width than the first word line transfer transistor arranged in the first layout area is arranged in a third layout area provided in the column direction along the end of the first layout area.

17. The nonvolatile semiconductor storage device according to claim 11, wherein the second layout area is provided in the column direction along the end of the first layout area, and an expanded word line transfer transistor having a longer distance in a channel length direction between an impurity diffusion layer connected to the word line and a gate electrode than the first word line transfer transistor arranged in the first layout area is arranged in a third layout area provided in the row direction along the end of the first layout area.

18. A nonvolatile semiconductor storage device comprising:

a memory cell array including electrically writable and erasable memory cells arranged in a matrix form in a row direction and a column direction;

a first word line that transmits voltage applied to a first memory cell in the memory cell array in the row direction;

a second word line that transmits voltage applied to a second memory cell in the memory cell array in the row direction; and a word line transfer unit that transfers voltage applied to a memory cell selected on the basis of an address to the word line, the word line transfer unit including:

a first word line transfer transistor that is arranged in a first layout area of the word line transfer unit and transfers voltage applied to the first memory cell to the first word line, and a second word line transfer transistor that is arranged in a second layout area provided outside an end of the first layout area and transfers voltage applied to the second memory cell to the second word line, wherein a shape of the first word line transfer transistor is different from a shape of the second word line transfer transistor, the second layout area borders a well, and the second word line transfer transistor has a larger channel width than the first word line transfer transistor.

19. The nonvolatile semiconductor storage device according to claim 18, further comprising:

a third word line that transmits voltage applied to a third memory cell in the memory cell array in the row direction, and a third word line transfer transistor that is arranged in a third layout area provided outside an end of the first layout area and transfers voltage applied to the third memory cell to the third word line, wherein a distance in a channel length direction between an impurity diffusion layer connected to the third word line and a gate electrode of the second word line transfer transistor is longer than a distance in a channel length direction between an impurity diffusion layer connected to the first word line and a gate electrode of the first word line transfer transistor, and the third layout area borders the well.

20. The nonvolatile semiconductor storage device according to claim 18, wherein the well circumscribes an outer periphery of the first layout area and the second layout area, the well having a higher impurity concentration than the semiconductor substrate in which the first layout area and the second layout area are arranged, and the well not including the first word line transfer transistor and the second word line transfer transistor.

* * * * *